US011862508B2

(12) United States Patent
Lu et al.

(10) Patent No.: US 11,862,508 B2
(45) Date of Patent: Jan. 2, 2024

(54) FINFET DEVICE AND METHOD OF FORMING SAME

(71) Applicant: Taiwan Semiconductor Manufacturing Co., Ltd., Hsinchu (TW)

(72) Inventors: Bo-Cyuan Lu, New Taipei (TW); Tai-Chun Huang, Hsinchu (TW); Chih-Tang Peng, Zhubei (TW); Chi On Chui, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 7 days.

(21) Appl. No.: 17/147,798

(22) Filed: Jan. 13, 2021

(65) Prior Publication Data

US 2022/0051932 A1 Feb. 17, 2022

Related U.S. Application Data

(60) Provisional application No. 63/064,551, filed on Aug. 12, 2020.

(51) Int. Cl.
 *H01L 21/762* (2006.01)
 *H01L 21/8234* (2006.01)
 (Continued)

(52) U.S. Cl.
 CPC ...... *H01L 21/76224* (2013.01); *H01L 21/764* (2013.01); *H01L 21/823481* (2013.01);
 (Continued)

(58) Field of Classification Search
 CPC ....... H01L 21/823481; H01L 21/76224; H01L 29/66545
 See application file for complete search history.

(56) References Cited

U.S. PATENT DOCUMENTS 5,766,971 A * 6/1998 Ahlgren ............ H01L 21/76224
 257/E21.546
2006/0145287 A1* 7/2006 Kim .................. H01L 21/76224
 257/E21.546

(Continued)

FOREIGN PATENT DOCUMENTS

KR 20180018947 A 2/2018
KR 20190112910 A 10/2019

*Primary Examiner* — Tuan A Hoang
(74) *Attorney, Agent, or Firm* — Slater Matsil, LLP

(57) ABSTRACT

A semiconductor device a method of forming the same are provided. The semiconductor device includes a substrate, a first isolation structure and a second isolation structure over the substrate, a semiconductor fin over the substrate and between the first isolation structure and the second isolation structure, and a third isolation structure extending through the semiconductor fin and between the first isolation structure and the second isolation structure. A top surface of the semiconductor fin is above a top surface of the first isolation structure and a top surface of the second isolation structure. The third isolation structure includes a first dielectric material and a second dielectric material over the first dielectric material. An interface between the first dielectric material and the second dielectric material is below the top surface of the first isolation structure and the top surface of the second isolation structure.

20 Claims, 50 Drawing Sheets

(51) Int. Cl.
  *H01L 27/088* (2006.01)
  *H01L 29/66* (2006.01)
  *H01L 29/78* (2006.01)
  *H01L 21/764* (2006.01)
  *H01L 21/8238* (2006.01)
  *H01L 27/092* (2006.01)
  *H01L 21/3065* (2006.01)
  *H01L 21/308* (2006.01)
  *H01L 21/311* (2006.01)

(52) U.S. Cl.
  CPC ........ *H01L 21/823814* (2013.01); *H01L 21/823821* (2013.01); *H01L 21/823864* (2013.01); *H01L 21/823871* (2013.01); *H01L 21/823878* (2013.01); *H01L 27/0886* (2013.01); *H01L 27/0924* (2013.01); *H01L 29/66545* (2013.01); *H01L 29/66795* (2013.01); *H01L 29/785* (2013.01); *H01L 29/7851* (2013.01); *H01L 21/3065* (2013.01); *H01L 21/3081* (2013.01); *H01L 21/3086* (2013.01); *H01L 21/31111* (2013.01)

(56) References Cited

U.S. PATENT DOCUMENTS

| | | | | |
|---|---|---|---|---|
| 2017/0141211 A1* | 5/2017 | Xie | ............ | H01L 29/785 |
| 2018/0047634 A1* | 2/2018 | Jun | ............ | H01L 21/823431 |
| 2019/0164844 A1* | 5/2019 | Huang | ............ | H01L 21/02183 |
| 2019/0305099 A1* | 10/2019 | Jo | ............ | H01L 21/823431 |

* cited by examiner

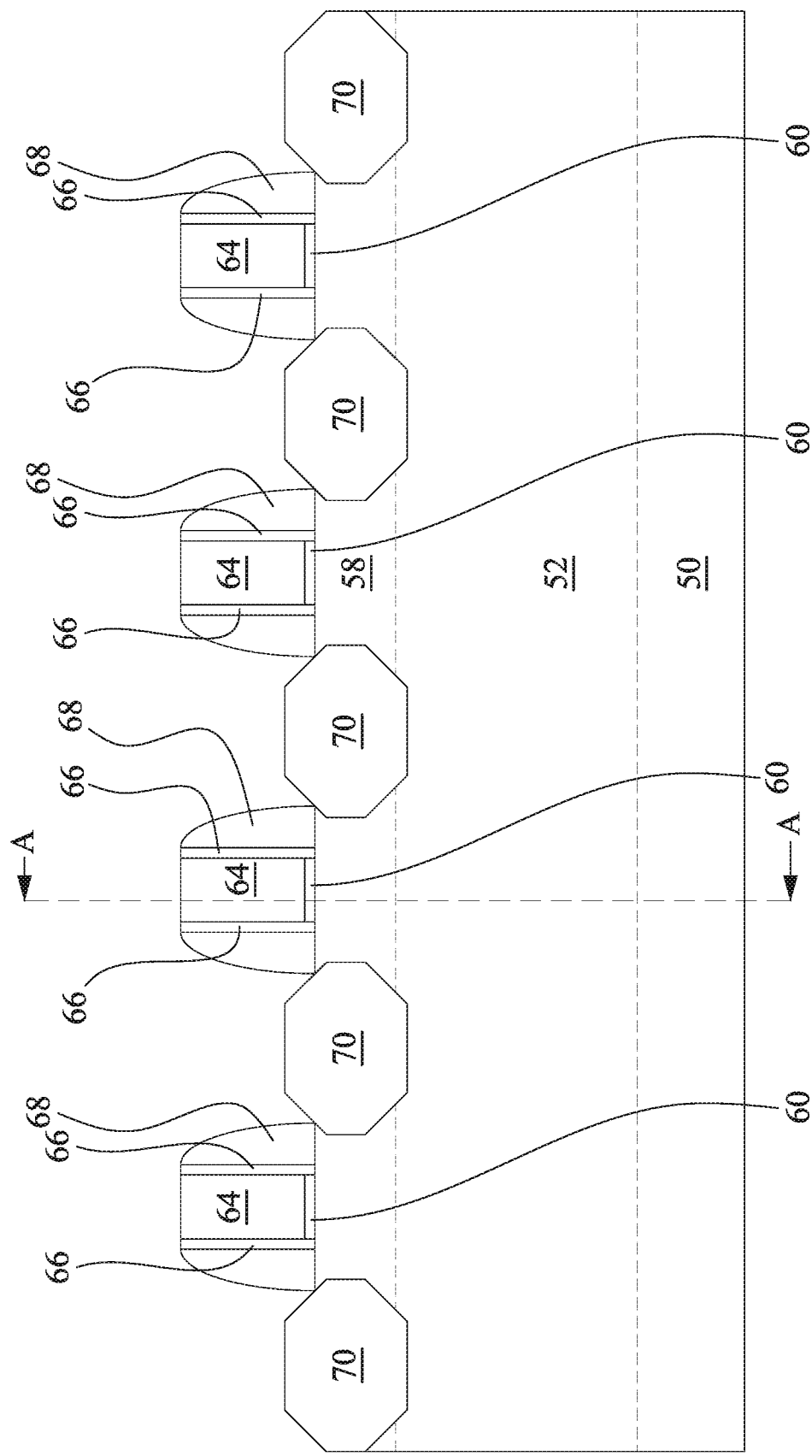

FINFET DEVICE AND METHOD OF FORMING SAME

PRIORITY CLAIM AND CROSS-REFERENCE

This application claims the benefit of U.S. Provisional Application No. 63/064,551, filed on Aug. 12, 2020, which application is hereby incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2, 3, 4, 5, 6, 7, 8A, 8B, 9A, 9B, 10A, 10B, 10C, 10D, 11A, 11B, 12A, 12B, 13A, 13B, 14A, 14B, 15A, 15B, 16A, 16B, 17A, 17B, 18A, 18B, 19A, 19B, 20A, 20B, 21A, 21B, 22A, 22B, 23A, 23B, 23C, 24A, 24B, 25A, 25B, 26A, 26B, 27A, 27B, 28A, 28B, 29A, and 29B are cross-sectional views of intermediate stages in the manufacturing of a FinFET device in accordance with some embodiments.

DETAILED DESCRIPTION

Figure 1:
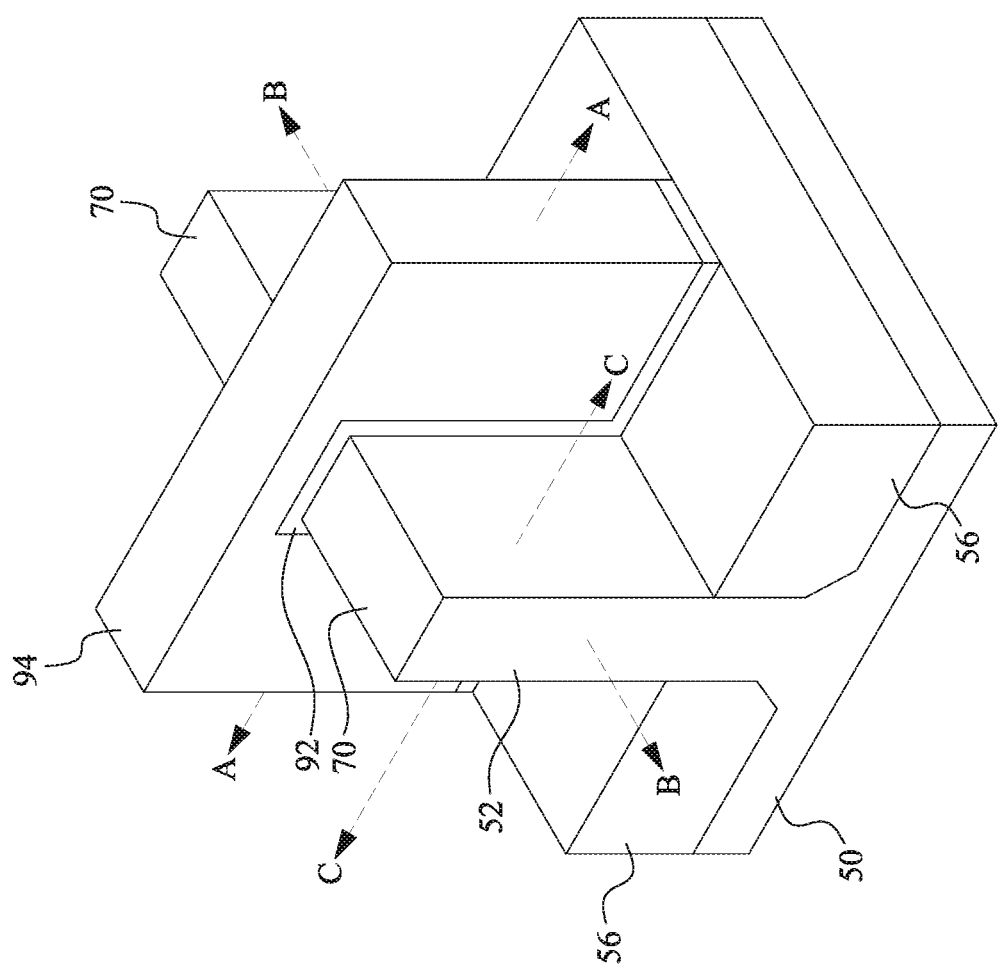
FIG. 1 illustrates an example of a FinFET in a three-dimensional view in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will be described with respect to a specific context, namely, a FinFET device and a method of forming the same. Various embodiments presented herein are discussed in the context of a FinFET device formed using a gate-last process. In other embodiments, a gate-first process may be used. Various embodiments discussed herein allow for improving a dielectric material gap-fill performance for a trench formed during a fin cut process, reducing or avoiding issues due to a seam and/or void formation in the dielectric material within the trench, reducing or avoiding shorting between contact plugs, and improving device and yield performance. In some embodiments, the trench formed during the fin cut process is filled with a plurality of dielectric materials. In some embodiments, the trench filling process may include filling the trench with a first dielectric material, partially removing the first dielectric material from the trench such that an upper portion of the trench is not filled with a dielectric material, and filling the upper portion of the trench with a second dielectric material. The second dielectric material may be same or different from the first dielectric material.

FIG. 1 illustrates an example of a FinFET in a three-dimensional view, in accordance with some embodiments. The FinFET comprises a fin 52 on a substrate 50 (e.g., a semiconductor substrate). Isolation regions 56 are disposed in the substrate 50, and the fin 52 protrudes above and from between neighboring STI regions 56. Although the STI regions 56 are described/illustrated as being separate from the substrate 50, as used herein the term "substrate" may be used to refer to just the semiconductor substrate or a semiconductor substrate inclusive of isolation regions. Additionally, although the fin 52 is illustrated as a single, continuous material as the substrate 50, the fin 52 and/or the substrate 50 may comprise a single material or a plurality of materials. In this context, the fin 52 refers to the portion extending between the neighboring STI regions 56.

A gate dielectric layer 92 is along sidewalls and over a top surface of the fin 52, and a gate electrode 94 is over the gate dielectric layer 92. Source/drain regions 70 are disposed in opposite sides of the fin 52 with respect to the gate dielectric layer 92 and the gate electrode 94. FIG. 1 further illustrates reference cross-sections that are used in later figures. Cross-section A-A is along a longitudinal axis of the gate electrode 94 and in a direction, for example, perpendicular to a direction of a current flow between the epitaxial source/drain regions 70 of the FinFET. Cross-section B-B is perpendicular to cross-section A-A and is along a longitudinal axis of the fin 52 and in a direction of, for example, the current flow between the epitaxial source/drain regions 70 of the FinFET. Cross-section C-C is parallel to cross-section A-A and extends through the source/drain region 70 of the FinFET. Subsequent figures refer to these reference cross-sections for clarity.

FIGS. 2, 3, 4, 5, 6, 7, 8A, 8B, 9A, 9B, 10A, 10B, 10C, 10D, 11A, 11B, 12A, 12B, 13A, 13B, 14A, 14B, 15A, 15B, 16A, 16B, 17A, 17B, 18A, 18B, 19A, 19B, 20A, 20B, 21A, 21B, 22A, 22B, 23A, 23B, 23C, 24A, 24B, 25A, 25B, 26A, 26B, 27A, 27B, 28A, 28B, 29A, and 29B are cross-sectional views of intermediate stages in the manufacturing of a FinFET device in accordance with some embodiments. FIGS. 2 through 7 illustrate cross-sectional views along the reference cross-section A-A illustrated in FIG. 1, except for multiple fins. FIGS. 8B-29B and 23C are illustrated along the reference cross-section B-B illustrated in FIG. 1, except for multiple gate structures. FIGS. 10C and 10D are illustrated along the reference cross-section C-C illustrated in FIG. 1, except for multiple fins and multiple source/drain regions. FIGS. 8A-29A are illustrated along the reference cross-section A-A illustrated in FIGS. 8B-29B, respectively.

Figure 2:
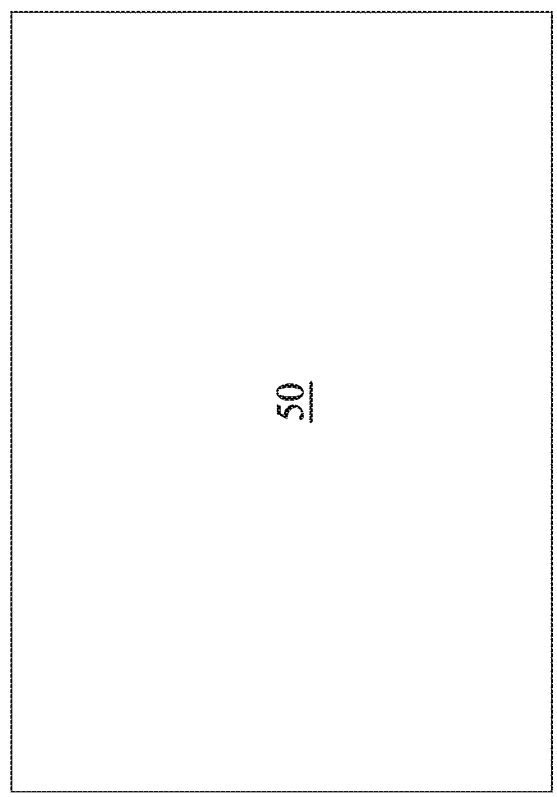

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

In some embodiments, the substrate 50 may have an n-type region and a p-type region (not individually illustrated). The n-type region is for forming n-type devices, such as NMOS transistors, e.g., n-type FinFETs. The p-type region is for forming p-type devices, such as PMOS transistors, e.g., p-type FinFETs. The n-type region may be physically separated from the p-type region, and any number of device features (e.g., other active devices, doped regions, isolation structures, etc.) may be disposed between the n-type region and the p-type region.

Figure 3:
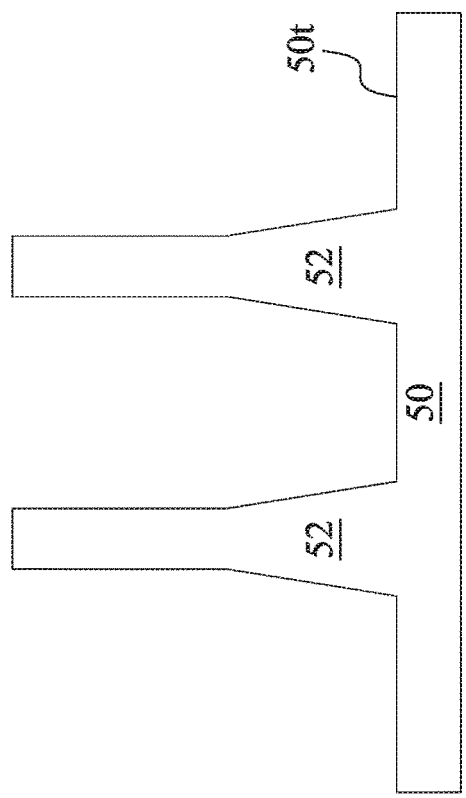

In FIG. 3, fins 52 are formed in the substrate 50. The fins 52 are semiconductor strips. In some embodiments, the fins 52 may be formed in the substrate 50 by etching trenches in the substrate 50. The etching may be any acceptable etch process, such as a reactive ion etch (RIE), neutral beam etch (NBE), a combination thereof, or the like. The etch process may be anisotropic. The fins 52 extend from an upper surface 50t of an un-patterned portion of the substrate 50. The un-patterned portion of the substrate 50 may be referred to as a substrate.

The fins 52 may be formed by any suitable method. For example, the fins 52 may be formed using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used as a mask to form the fins 52.

Figure 4:
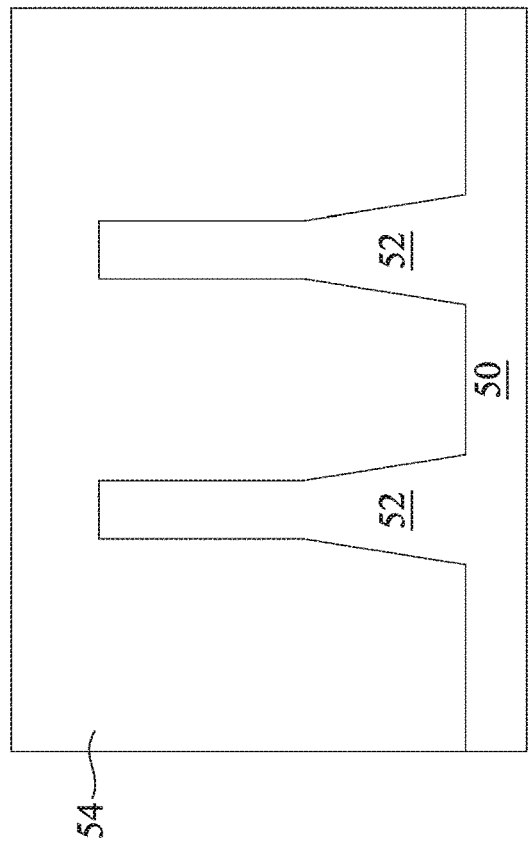

In FIG. 4, an insulation material 54 is formed over the substrate 50 and between neighboring fins 52. The insulation material 54 may be an oxide, such as silicon oxide, a nitride, a combination thereof, or the like, and may be formed by a high density plasma chemical vapor deposition (HDP-CVD), a flowable CVD (FCVD) (e.g., a CVD-based material deposition in a remote plasma system and post curing to make it convert to another material, such as an oxide), a combination thereof, or the like. Other insulation materials formed by any acceptable process may be used. In the illustrated embodiment, the insulation material 54 is silicon oxide formed by a FCVD process. An anneal process may be performed once the insulation material is formed. In an embodiment, the insulation material 54 is formed such that excess insulation material 54 covers the fins 52. Although the insulation material 54 is illustrated as a single layer, some embodiments may utilize multiple layers. For example, in some embodiments, a liner (not shown) may first be formed along surfaces of the substrate 50 and the fins 52. Thereafter, a fill material, such as those discussed above may be formed over the liner.

Figure 5:
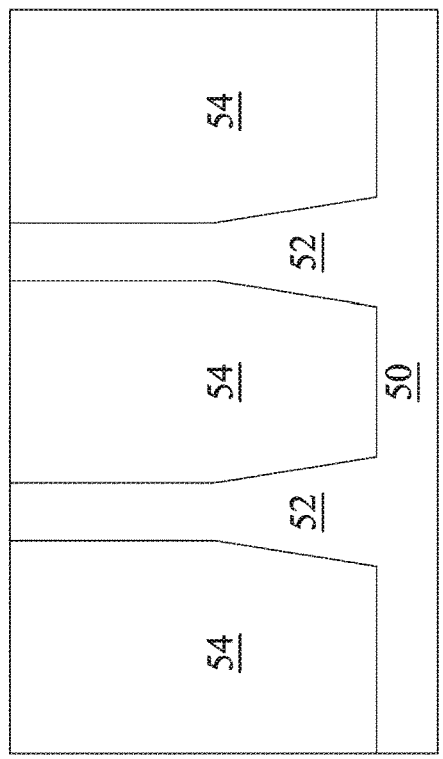

In FIG. 5, a removal process is applied to the insulation material 54 to remove excess portions of the insulation material 54 over the fins 52. In some embodiments, a planarization process, such as a chemical mechanical polishing (CMP) process, an etch back process, combinations thereof, or the like, may be utilized. The planarization process exposes the fins 52, such that top surfaces of the fins 52 and the top surface of the insulation material 54 are substantially level or coplanar (within process variations) after the planarization process is completed.

Figure 6:
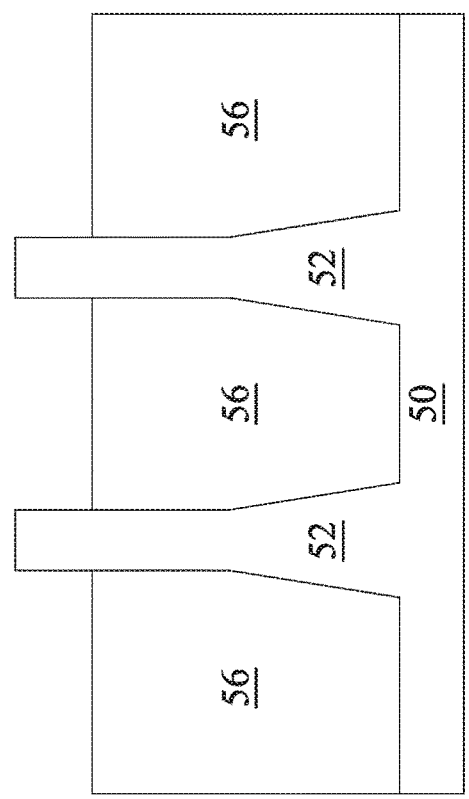

In FIG. 6, the insulation material 54 (see FIG. 5) is recessed to form shallow trench isolation (STI) regions 56. The insulation material 54 is recessed such that upper portions of fins 52 protrude from between neighboring STI regions 56. Further, the top surfaces of the STI regions 56 may have a flat surface as illustrated, a convex surface, a concave surface (such as dishing), or a combination thereof. The top surfaces of the STI regions 56 may be formed flat, convex, and/or concave by an appropriate etch. The STI regions 56 may be recessed using an acceptable etching process, such as one that is selective to the material of the insulation material 54 (e.g., etches the material of the insulation material 54 at a faster rate than the material of the fins 52). For example, a chemical oxide removal with a suitable etch process using, for example, dilute hydrofluoric (dHF) acid may be used.

The process described with respect to FIGS. 2 through 6 is just one example of how the fins 52 may be formed. In some embodiments, the fins may be formed by an epitaxial growth process. For example, a dielectric layer can be formed over a top surface of the substrate 50, and trenches can be etched through the dielectric layer to expose the underlying substrate 50. Homoepitaxial structures can be epitaxially grown in the trenches, and the dielectric layer can be recessed such that the homoepitaxial structures protrude from the dielectric layer to form fins. Additionally, in some embodiments, heteroepitaxial structures can be used for the fins. For example, the fins 52 in FIG. 5 can be recessed, and a material different from the fins 52 may be epitaxially grown over the recessed fins 52. In such embodiments, the fins comprise the recessed material as well as the epitaxially grown material disposed over the recessed material. In an even further embodiment, a dielectric layer can be formed over a top surface of the substrate 50, and trenches can be etched through the dielectric layer. Heteroepitaxial structures can then be epitaxially grown in the trenches using a material different from the substrate 50, and the dielectric layer can be recessed such that the heteroepitaxial structures protrude from the dielectric layer to form the fins. In some embodiments where homoepitaxial or heteroepitaxial structures are epitaxially grown, the epitaxially grown materials may be in situ doped during growth, which may obviate prior and subsequent implantations, although in situ and implantation doping may be used together.

Still further, it may be advantageous to epitaxially grow a material in the n-type region of the substrate different from a material in the p-type region of the substrate 50. In various embodiments, upper portions of the fins 52 may be formed from silicon germanium ($Si_xGe_{1-x}$, where x can be in the range of 0 to 1), silicon carbide, pure or substantially pure germanium, a III-V compound semiconductor, a II-VI compound semiconductor, or the like. For example, the available materials for forming III-V compound semiconductor include, but are not limited to, InAs, AlAs, GaAs, InP, GaN, InGaAs, InAlAs, GaSb, AlSb, AlP, GaP, and the like.

Further in FIG. 6, appropriate wells (not shown) may be formed in the fins 52 and/or the substrate 50. In some embodiments, a P well may be formed in the n-type region of the substrate 50, and an N well may be formed in the p-type region of the substrate 50. In some embodiments, a P well or an N well are formed in both the n-type and p-type regions of the substrate 50. In the embodiments with different well types, the different implant steps for the n-type region and the p-type region of the substrate 50 may be achieved using a photoresist or other masks (not shown). For example, a first photoresist may be formed over the fins 52 and the STI regions 56 in both the n-type region and the p-type region of the substrate 50. The first photoresist is patterned to expose the p-type region of the substrate 50. The first photoresist can be formed by using a spin-on technique and can be patterned using acceptable photolithography techniques. Once the first photoresist is patterned, an n-type impurity implantation is performed in the p-type region of the substrate 50, while the remaining portion of the first photoresist acts as a mask to substantially prevent n-type impurities from being implanted into the n-type region of the substrate 50. The n-type impurities may be phosphorus, arsenic, antimony, or the like, implanted in the region to a dose of equal to or less than $10^{15}$ $cm^{-2}$, such as between about $10^{12}$ $cm^{-2}$ and about $10^{15}$ $cm^{-2}$. In some embodiments, the n-type impurities may be implanted at an implantation energy of about 1 keV to about 10 keV. After the implantation, the first photoresist is removed, such as by an acceptable ashing process followed by a wet clean process.

Following the implantation of the p-type region of the substrate 50, a second photoresist is formed over the fins 52 and the STI regions 56 in both the p-type and n-type regions of the substrate 50. The second photoresist is patterned to expose the n-type region of the substrate 50. The second photoresist can be formed by using a spin-on technique and can be patterned using acceptable photolithography techniques. Once the second photoresist is patterned, a p-type impurity implantation may be performed in the n-type region of the substrate 50, while the remaining portion of the second photoresist acts as a mask to substantially prevent p-type impurities from being implanted into the p-type region of the substrate 50. The p-type impurities may be boron, $BF_2$, indium, or the like, implanted in the region to a dose of equal to or less than $10^{15}$ $cm^{-2}$, such as between about $10^{12}$ $cm^{-2}$ and about $10^{15}$ $cm^{-2}$. In some embodiments, the p-type impurities may be implanted at an implantation energy of about 1 keV to about 10 keV. After the implantation, the second photoresist may be removed, such as by an acceptable ashing process followed by a wet clean process.

After performing the implantations of the n-type and p-type regions of the substrate 50, an anneal process may be performed to activate the p-type and/or n-type impurities that were implanted. In some embodiments, the grown materials of epitaxial fins may be in situ doped during growth, which may obviate the implantations, although in situ doping and implantation doping may be used together.

Figure 7:
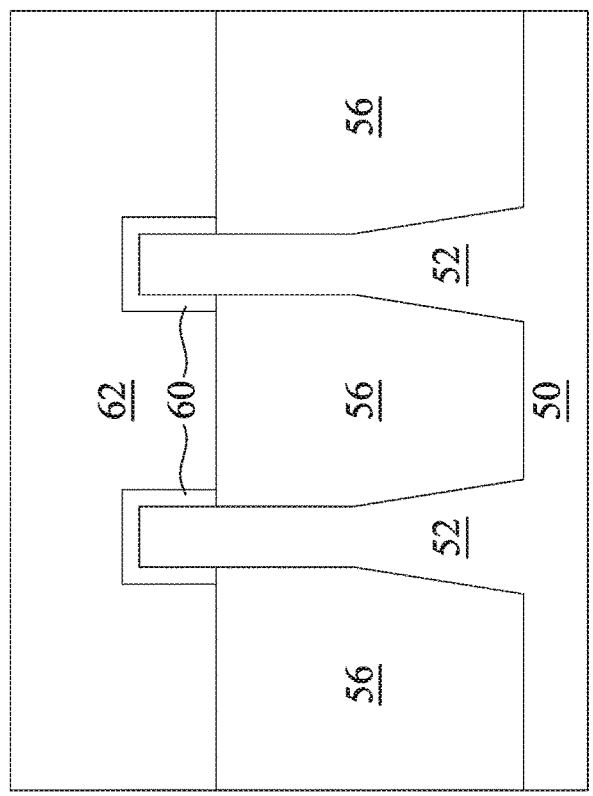

In FIG. 7, a dummy dielectric layer 60 is formed on the fins 52. The dummy dielectric layer 60 may be, for example, silicon oxide, silicon nitride, a combination thereof, or the like, and may be deposited or thermally grown according to acceptable techniques. Subsequently, a dummy gate layer 62 is formed over the dummy dielectric layer 60. The dummy gate layer 62 may be deposited over the dummy dielectric layer 60 and then planarized using, for example, a CMP process. The dummy gate layer 62 may be a conductive material and may be selected from a group including amorphous silicon, polycrystalline-silicon (polysilicon), polycrystalline silicon-germanium (poly-SiGe), metallic nitrides, metallic silicides, metallic oxides, metals, combinations thereof, and the like. The dummy gate layer 62 may be deposited by physical vapor deposition (PVD), CVD, sputter deposition, or other techniques known and used in the art for depositing conductive materials. The dummy gate layer 62 may be made of other materials that have a higher etching selectivity than materials of the STI regions 56. It is noted that the dummy dielectric layer 60 is shown covering only the fins 52 for illustrative purposes only. In some embodiments, the dummy dielectric layer 60 may be deposited such that the dummy dielectric layer 60 covers the STI regions 56, extending between the dummy gate layer 62 and the STI regions 56.

FIGS. 8A, 8B, 9A, 9B, 10A, 10B, 10C, 10D, 11A, 11B, 12A, 12B, 13A, 13B, 14A, 14B, 15A, 15B, 16A, 16B, 17A, 17B, 18A, 18B, 19A, 19B, 20A, 20B, 21A, 21B, 22A, 22B, 23A, 23B, 23C, 24A, 24B, 25A, 25B, 26A, 26B, 27A, 27B, 28A, 28B, 29A, and 29B illustrate various additional steps in the manufacturing of a FinFET device in accordance with some embodiments. FIGS. 8A, 8B, 9A, 9B, 10A, 10B, 10C, 10D, 11A, 11B, 12A, 12B, 13A, 13B, 14A, 14B, 15A, 15B, 16A, 16B, 17A, 17B, 18A, 18B, 19A, 19B, 20A, 20B, 21A, 21B, 22A, 22B, 23A, 23B, 23C, 24A, 24B, 25A, 25B, 26A, 26B, 27A, 27B, 28A, 28B, 29A, and 29B illustrate features in either of the n-type region and the p-type region of the substrate 50. For example, the structures illustrated in FIGS. 8A, 8B, 9A, 9B, 10A, 10B, 10C, 10D, 11A, 11B, 12A, 12B, 13A, 13B, 14A, 14B, 15A, 15B, 16A, 16B, 17A, 17B, 18A, 18B, 19A, 19B, 20A, 20B, 21A, 21B, 22A, 22B, 23A, 23B, 23C, 24A, 24B, 25A, 25B, 26A, 26B, 27A, 27B, 28A, 28B, 29A, and 29B may be applicable to both the n-type region and the p-type region of the substrate 50. Differences (if any) in the structures of the n-type region and the p-type region of the substrate 50 are described in the text accompanying each figure.

Figure 8A:
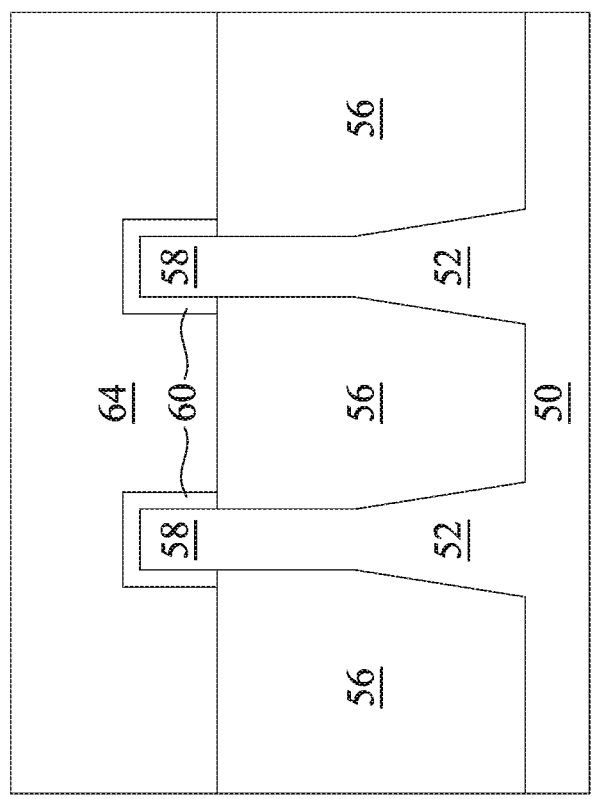
Figure 8B:
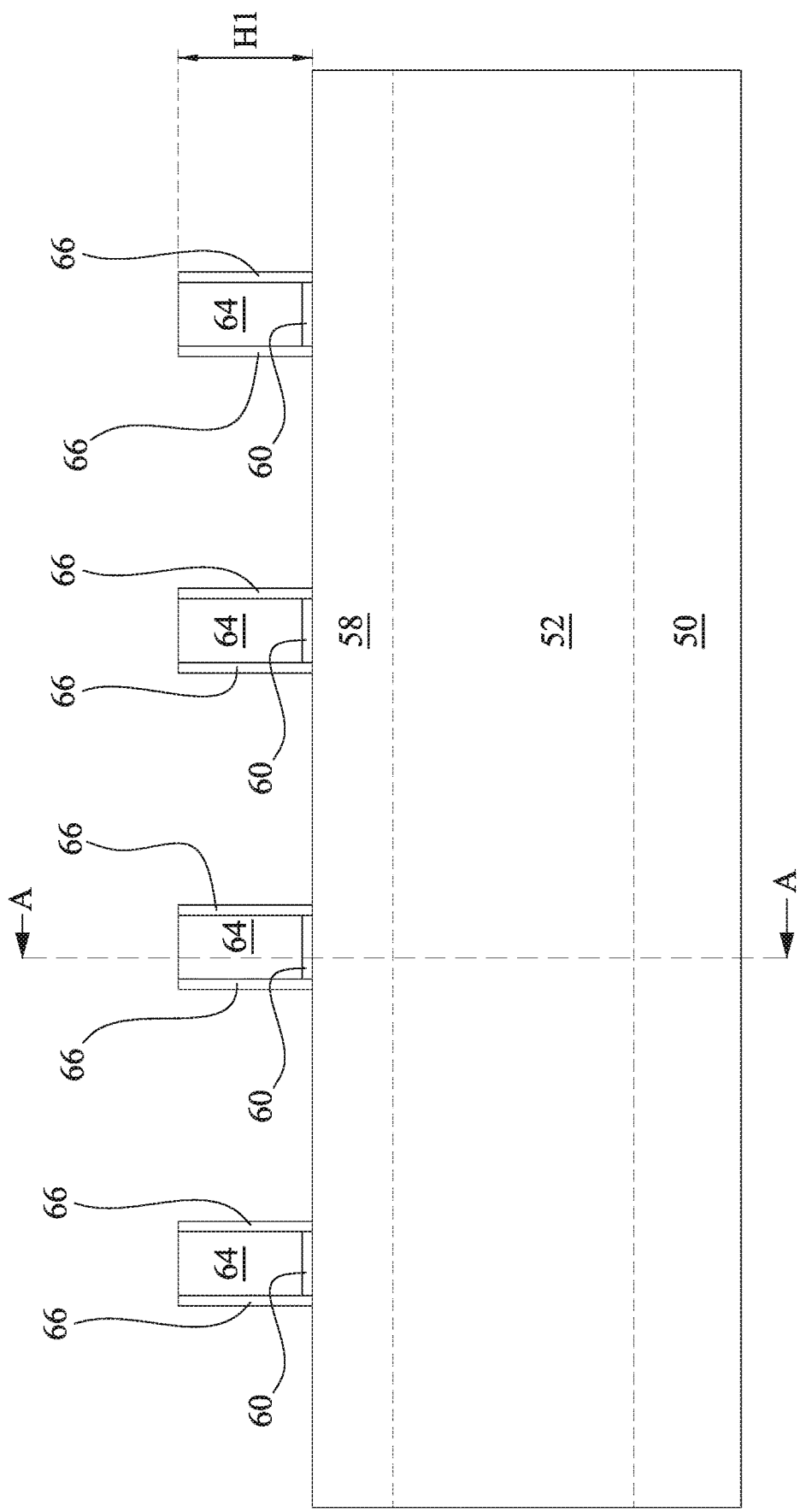

In FIGS. 8A and 8B, the dummy gate layer 62 (see FIG. 7) is patterned to form dummy gates 64. The dummy gate layer 62 may be patterned using acceptable photolithography and etching techniques. In some embodiments, the etching techniques may include one or more anisotropic etch processes such as RIE, NBE, a combination thereof, or the like. The dummy gates 64 cover channel regions 58 of the fins 52. The pattern of the patterned mask may be used to physically separate each of the dummy gates 64 from adjacent ones of the dummy gates 64. The dummy gates 64 may also have a lengthwise direction substantially perpendicular to the lengthwise direction of respective one of the fins 52. As described below in greater detail, the dummy gates 64 are sacrificial gates and are subsequently replaced by replacement gates. Accordingly, dummy gates 64 may also be referred to as sacrificial gates. In other embodiments, some of the dummy gates 64 are not replaced and remain in the final structure of the resulting FinFET device. The dummy gates 64 have top surfaces, which are disposed above the fins 52 at a height H1 as measured from the top surfaces of the fins 52. In some embodiments, the height H1 is between about 90 nm and about 120 nm.

Further in FIGS. 8A and 8B, gate seal spacers 66 may be formed on exposed surfaces of the dummy gates 64 and/or the fins 52. A thermal oxidation or a deposition followed by an anisotropic etch may form the gate seal spacers 66. The gate seal spacers 66 may comprise silicon oxide, silicon nitride, SiCN, SiOC, SiOCN, a combination thereof, or the like. After the formation of the gate seal spacers 66, implants for lightly doped source/drain (LDD) regions (not explicitly illustrated) may be performed. In the embodiments with different device types, similar to the implants discussed above in FIG. 6, a mask, such as a photoresist, may be formed over the n-type region, while exposing the p-type region, and appropriate type (e.g., p-type) impurities may be implanted into the exposed fins 52 in the p-type region. The mask may then be removed. Subsequently, a mask, such as a photoresist, may be formed over the p-type region, while exposing the n-type region, and appropriate type impurities (e.g., n-type) may be implanted into the exposed fins 52 in the n-type region. The mask may then be removed. The n-type impurities may be the any of the n-type impurities previously discussed, and the p-type impurities may be the any of the p-type impurities previously discussed. The lightly doped source/drain regions may have a dose of impurities of from about $10^{12}$ cm$^{-2}$ to about $10^{16}$ cm$^{-2}$. In some embodiments, the suitable impurities may be implanted at an implantation energy of about 1 keV to about 10 keV. An anneal may be used to activate the implanted impurities.

Figure 9A:
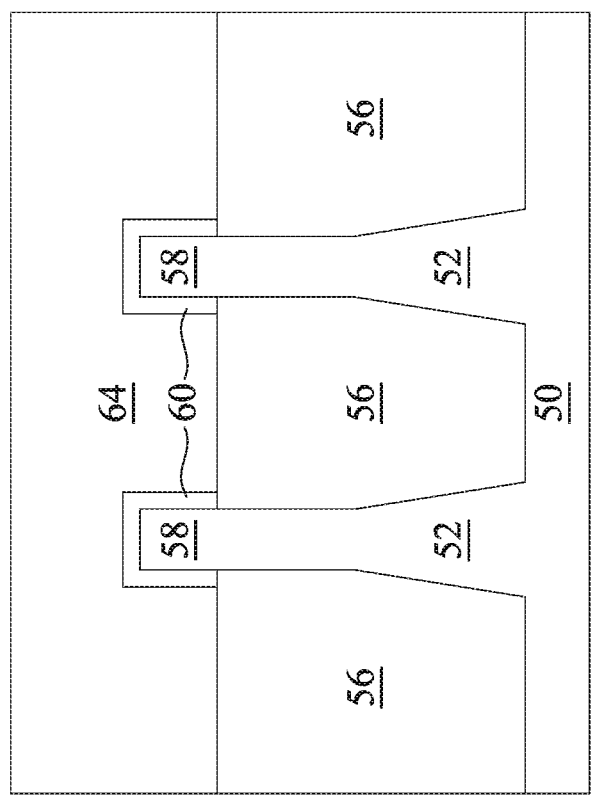
Figure 9B:
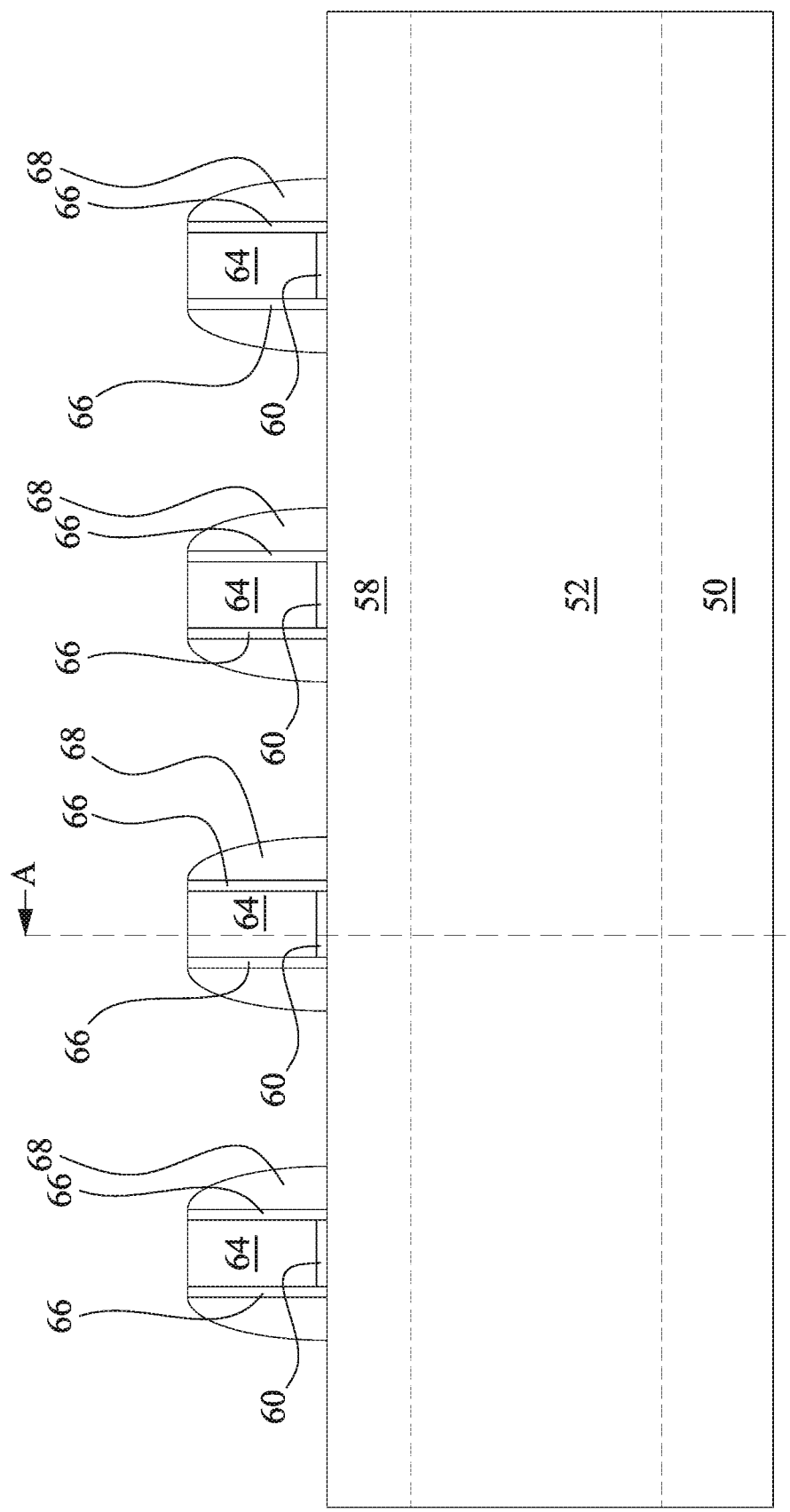

In FIGS. 9A and 9B, gate spacers 68 are formed on the gate seal spacers 66 along sidewalls of the dummy gates 64. The gate spacers 68 may be formed by conformally depositing an insulating material and subsequently anisotropically etching the insulating material. The insulating material of the gate spacers 68 may comprise silicon oxide, silicon nitride, SiCN, SiOC, SiOCN, a combination thereof, or the like. In some embodiments, the gate spacers 68 may comprise a plurality of layers (not shown), such that the layers comprise different materials. In some embodiments, the gate spacers 68 and the gate seal spacers 66 may comprise a same material. In other embodiments, the gate spacers 68 and the gate seal spacers 66 may comprise different materials.

It is noted that the above disclosure generally describes a process of forming spacers and LDD regions. Other processes and sequences may be used. For example, fewer or additional spacers may be utilized, different sequence of steps may be utilized (e.g., the gate seal spacers 66 may not be etched prior to forming the gate spacers 68, yielding "L-shaped" gate seal spacers, spacers may be formed and removed, and/or the like). Furthermore, the n-type and p-type devices may be formed using a different structures and steps. For example, LDD regions for n-type devices may be formed prior to forming the gate seal spacers 66 while the LDD regions for p-type devices may be formed after forming the gate seal spacers 66.

Figure 10A:
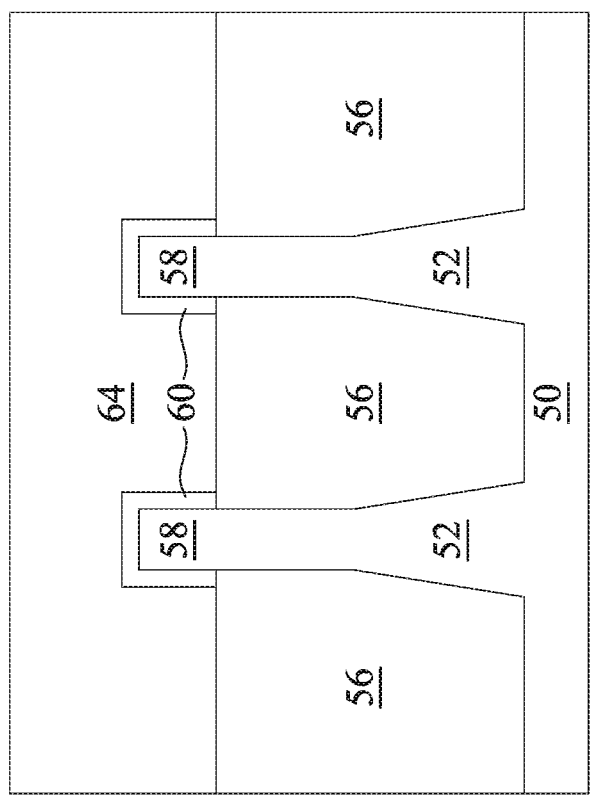
Figure 10D:
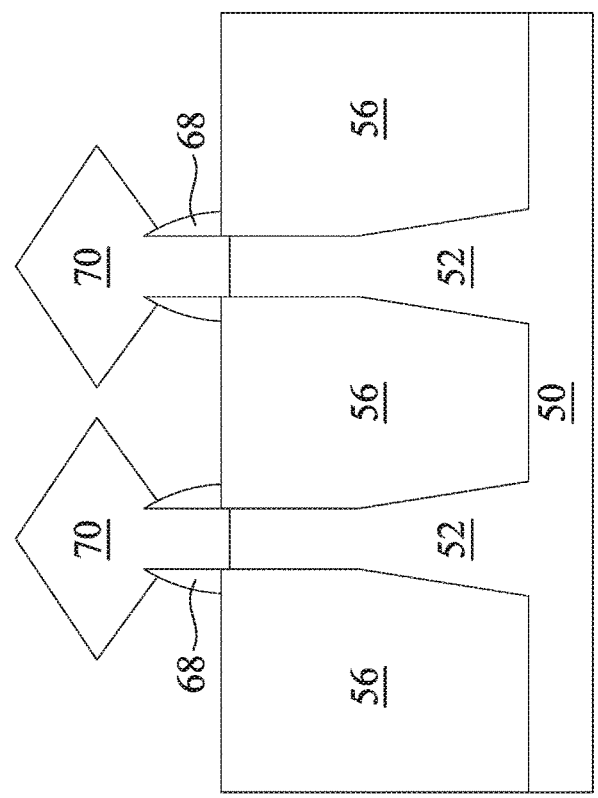
Figure 10C:
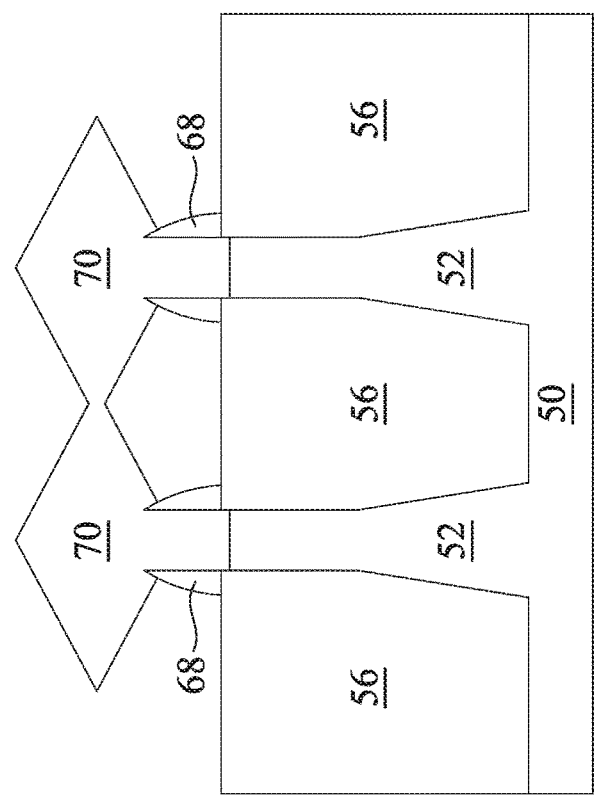

In FIGS. 10A and 10B, epitaxial source/drain regions 70 are formed in the fins 52 to exert stress in the respective channel regions 58, thereby improving device performance. The epitaxial source/drain regions 70 are formed in the fins 52 such that each dummy gate 64 is disposed between respective neighboring pairs of the epitaxial source/drain regions 70. In some embodiments, the epitaxial source/drain regions 70 may extend into the fins 52. In some embodiments, the gate spacers 68 are used to separate the epitaxial source/drain regions 70 from the dummy gates 64 by an appropriate lateral distance so that the epitaxial source/drain regions 70 do not short out subsequently formed gates of the resulting FinFET device.

The epitaxial source/drain regions 70 in the n-type region of the substrate 50 may be formed by masking the p-type region of the substrate 50 and etching source/drain regions of the fins 52 in the n-type region of the substrate 50 to form recesses in the fins 52. Then, the epitaxial source/drain regions 70 in the n-type region of the substrate 50 are epitaxially grown in the recesses. The epitaxial source/drain regions 70 may include any acceptable material, such as appropriate for n-type FinFETs. For example, if the fin 52 is silicon, the epitaxial source/drain regions 70 in the n-type region of the substrate 50 may include materials exerting a tensile strain in the channel region 58, such as silicon, SiC, SiCP, SiP, a combination thereof, or the like. The epitaxial source/drain regions 70 in the n-type region of the substrate 50 may have surfaces raised from respective surfaces of the fins 52 and may have facets.

The epitaxial source/drain regions 70 in the p-type region of the substrate 50 may be formed by masking the n-type region of the substrate 50 and etching source/drain regions of the fins 52 in the p-type region of the substrate 50 to form recesses in the fins 52. Then, the epitaxial source/drain regions 70 in the p-type region of the substrate 50 are epitaxially grown in the recesses. The epitaxial source/drain regions 70 may include any acceptable material, such as appropriate for p-type FinFETs. For example, if the fin 52 is silicon, the epitaxial source/drain regions 70 in the p-type region of the substrate 50 may comprise materials exerting a compressive strain in the channel region 58, such as SiGe, SiGeB, Ge, GeSn, a combination thereof, or the like. The epitaxial source/drain regions 70 in the p-type region of the substrate 50 may also have surfaces raised from respective surfaces of the fins 52 and may have facets.

The epitaxial source/drain regions 70 and/or the fins 52 may be implanted with dopants, similar to the process previously discussed for forming lightly-doped source/drain regions, followed by an anneal. The epitaxial source/drain regions 70 may have an impurity concentration of between about $10^{19}$ cm$^{-3}$ and about $10^{21}$ cm$^{-3}$. The n-type and/or p-type impurities for the epitaxial source/drain regions 70 may be any of the impurities previously discussed. In some embodiments, the epitaxial source/drain regions 70 may be in situ doped during growth.

As a result of the epitaxy processes used to form the epitaxial source/drain regions 70 in the n-type region and the p-type region of the substrate 50, upper surfaces of the epitaxial source/drain regions have facets which expand laterally outward beyond sidewalls of the fins 52. In some embodiments, these facets cause adjacent epitaxial source/drain regions 70 of a same FinFET to merge as illustrated by FIG. 10C. In other embodiments, adjacent epitaxial source/drain regions 70 remain separated after the epitaxy process is completed as illustrated by FIG. 10D. In the embodiments illustrated in FIGS. 10C and 10D, the gate spacers 68 are formed covering a portion of the sidewalls of the fins 52 that extend above the STI regions 56 thereby blocking the epitaxial growth. In other embodiments, the spacer etch used to form the gate spacers 68 may be adjusted to remove the spacer material from the sidewalls of the fins 52 to allow the epitaxially grown region to extend to the surface of the STI region 56.

Figure 11A:
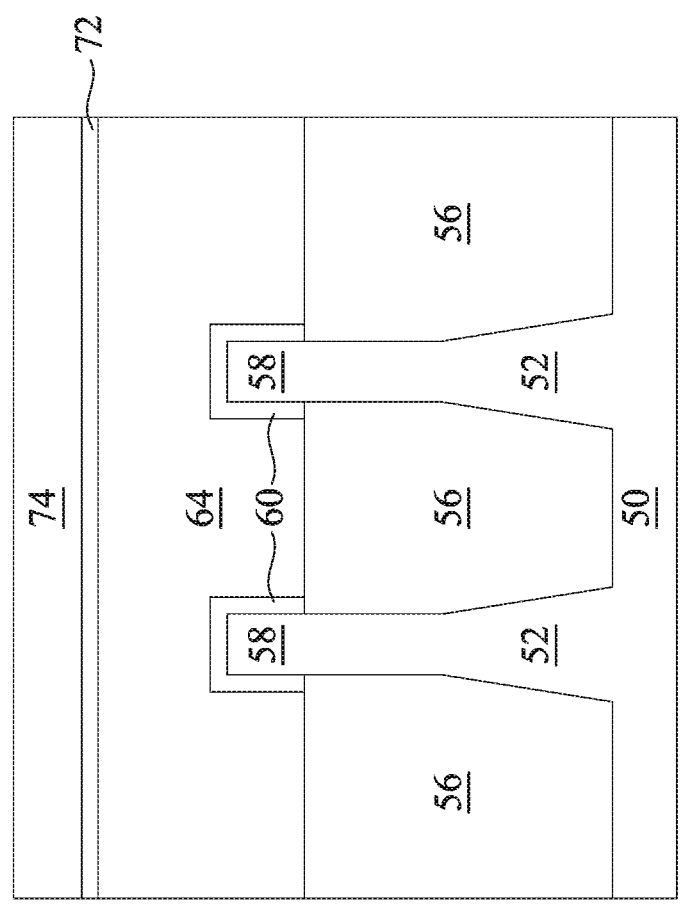
Figure 11B:
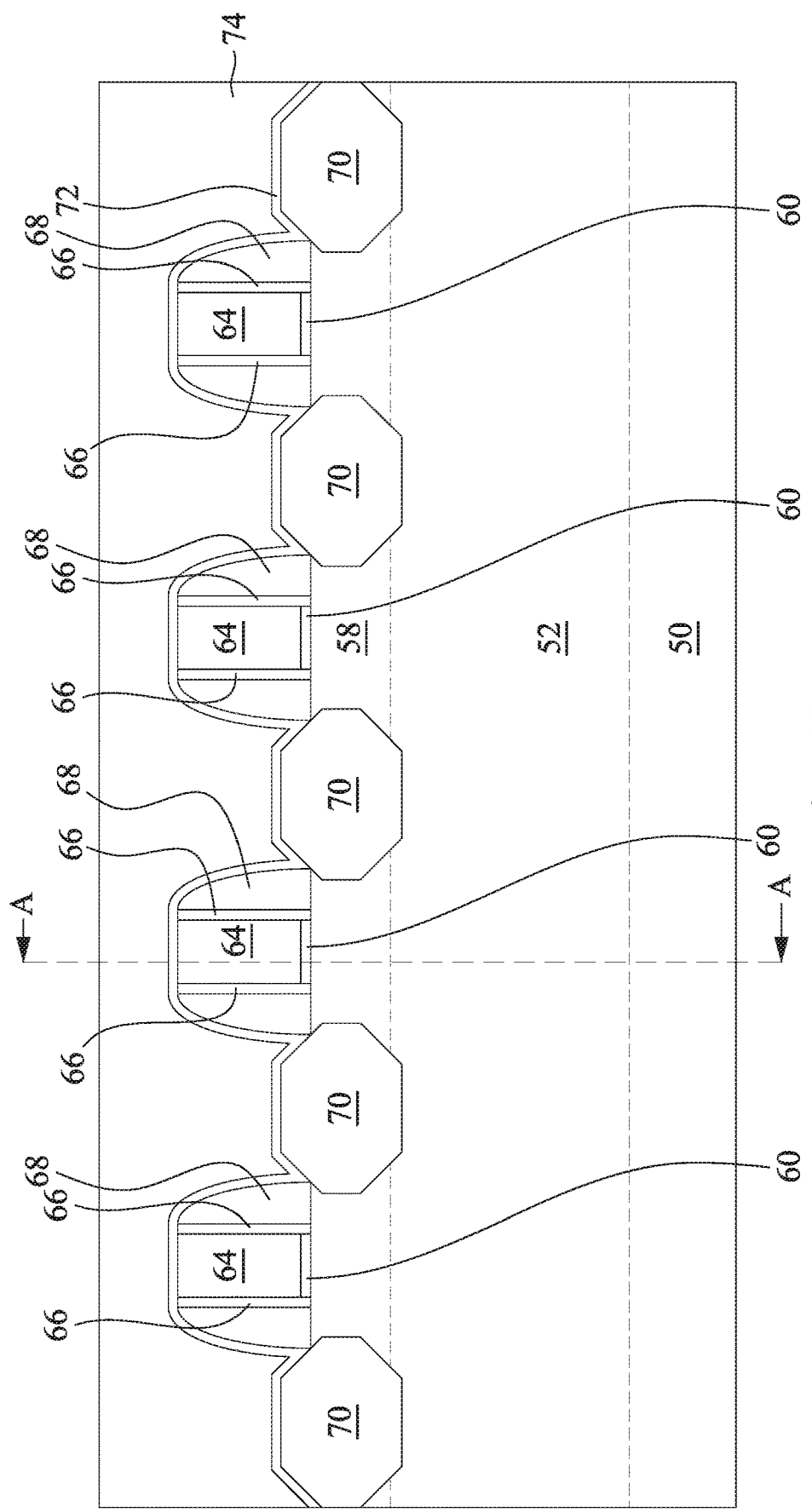

In FIGS. 11A and 11B, an interlayer dielectric (ILD) 74 is deposited over the structure illustrated in FIGS. 10A and 10B. The ILD 74 may be formed of a dielectric material, and may be deposited by any suitable method, such as CVD, plasma-enhanced CVD (PECVD), FCVD, a combination thereof, or the like. Dielectric materials may include Phospho-Silicate Glass (PSG), Boro-Silicate Glass (BSG), Boron-Doped Phospho-Silicate Glass (BPSG), undoped Silicate Glass (USG), a combination thereof, or the like. Other insulation materials formed by any acceptable process may be also used. In some embodiments, an etch stop layer (ESL) 72 is disposed between the ILD 74, and the epitaxial source/drain regions 70 and the gate spacers 68. The ESL 72 may comprise a dielectric material, such as, silicon nitride, silicon oxide, silicon oxynitride, a combination thereof, or the like, having a different etch rate than the material of the overlying ILD 74.

Figure 12A:
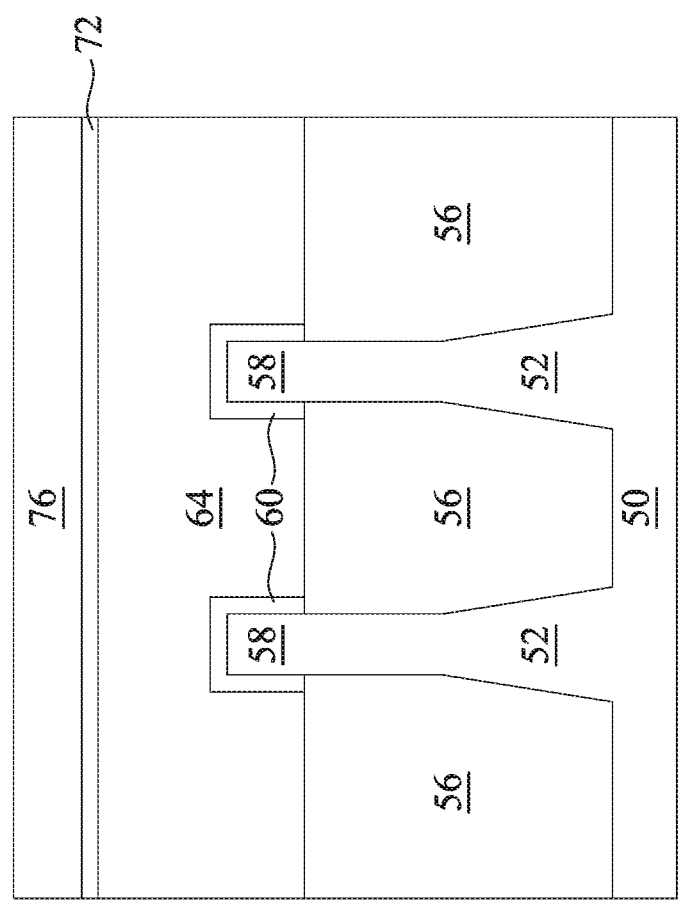
Figure 12B:
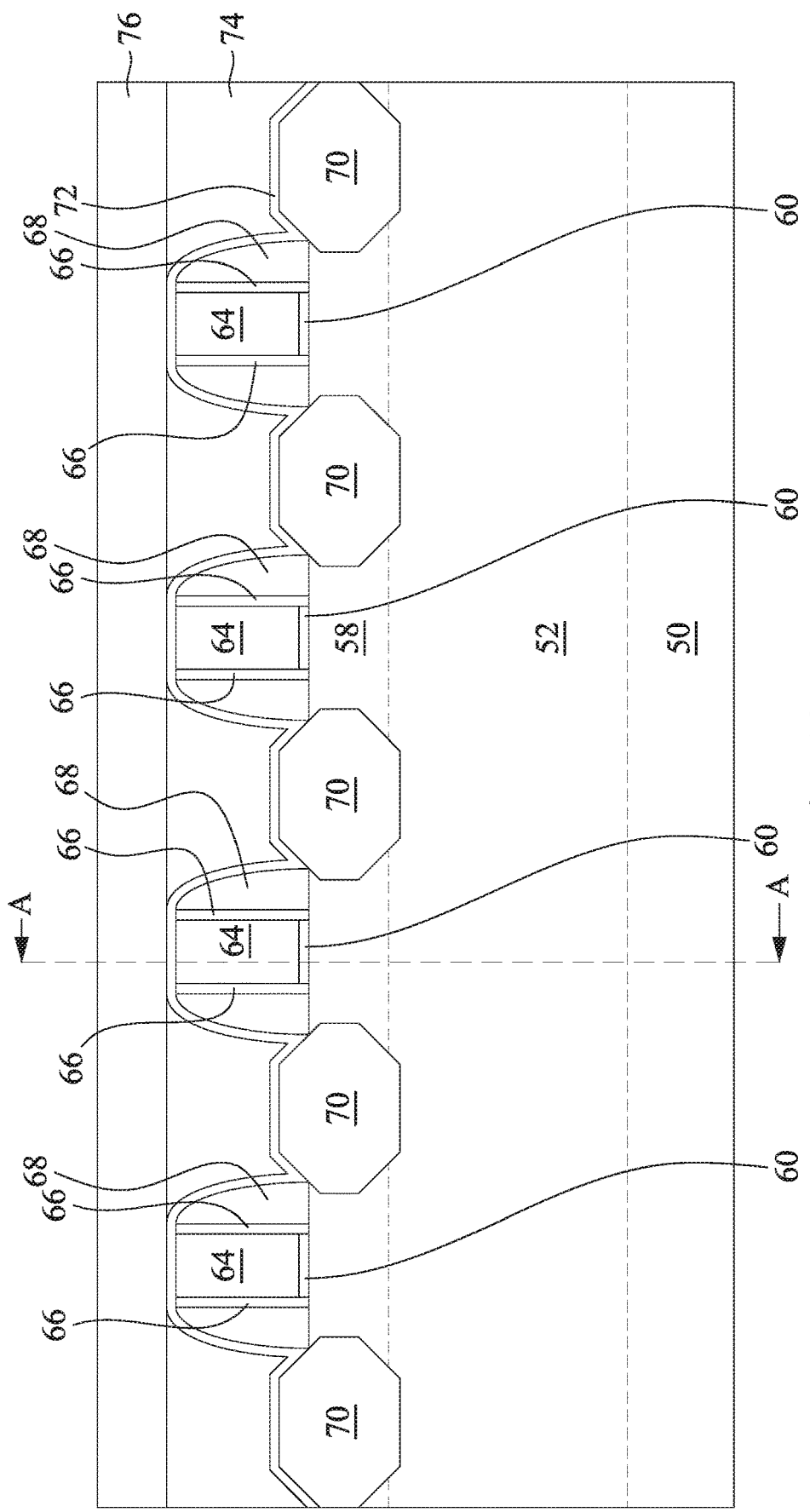

In FIGS. 12A and 12B, a planarization process, such as a CMP process, may be performed to level the top surface of the ILD 74 with the topmost surface of the ESL 72. After performing the planarization process, a hard mask layer 76 is formed over the dummy gates 64, the ILD 74, and the ESL 72. In some embodiments, the hard mask layer 76 may comprise one or more layers of silicon oxide, SiN, SiON, a combination thereof, or the like, and may be formed using ALD, CVD, PECVD, a combination thereof, or the like.

Figure 13A:
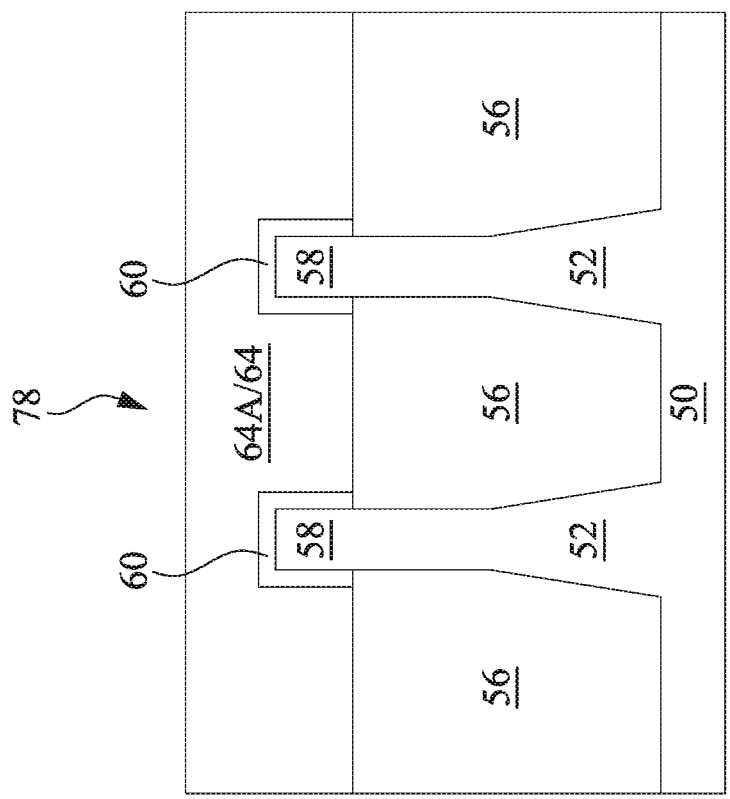
Figure 13B:
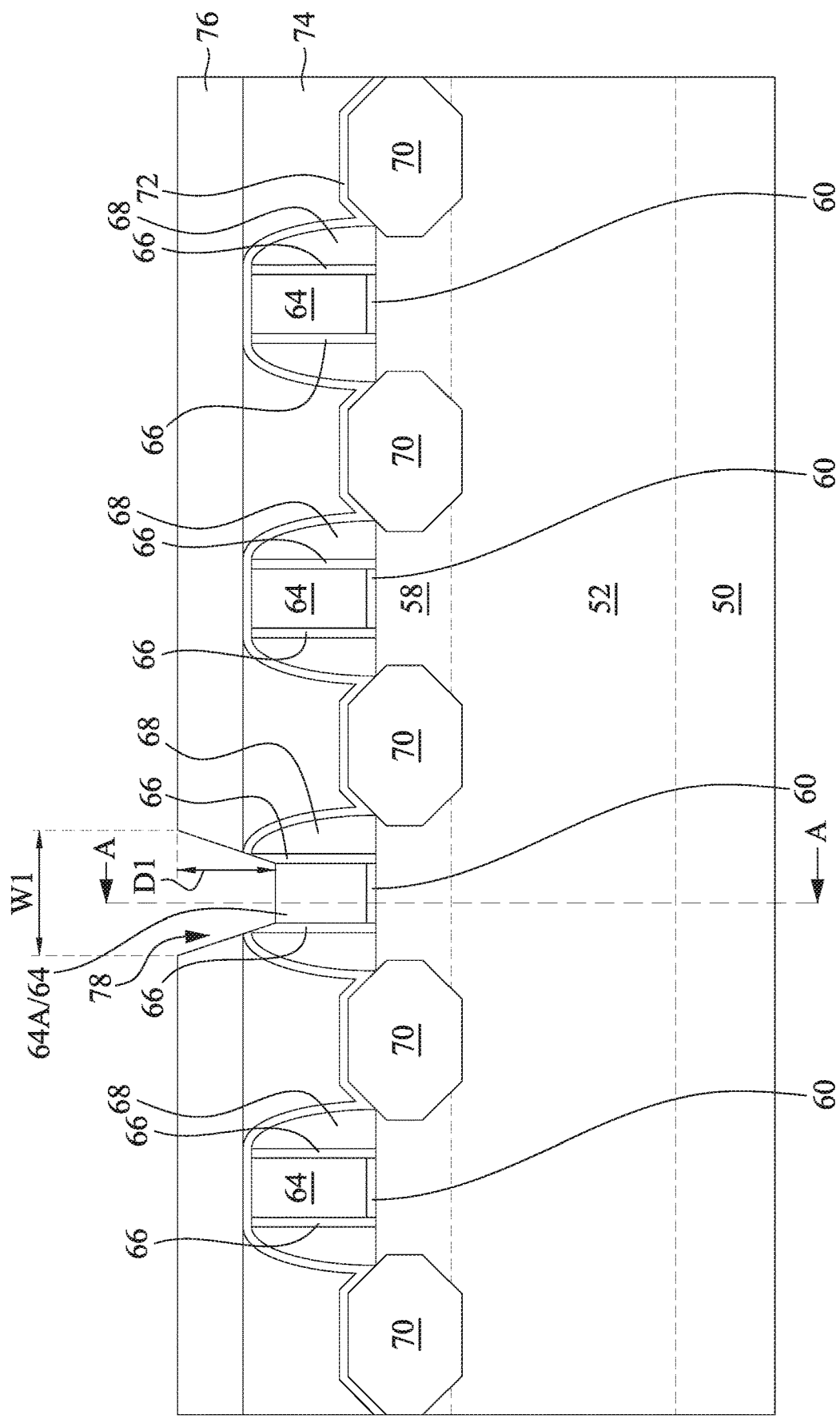

FIGS. 13A, 13B, 14A, 14B, 15A, 15B, 16A, 16B, 17A, and 17B illustrate a fin cut process performed on the structure of FIGS. 12A and 12B in accordance with some embodiments. In FIGS. 13A and 13B, a patterning process is performed on the hard mask layer 76 to form a trench 78 in the hard mask layer 76 over the dummy gate 64A. The trench 78 exposes the dummy gate 64A. In some embodiments, the hard mask layer 76 is patterned using suitable photolithography and etching processes. The etching processes may comprise one or more wet etch processes, one or more dry etching process, combinations thereof, or the like. The etching processes may be anisotropic etching processes. In some embodiments, etchants used for etching the hard mask layer 76 may comprise $CH_xF_y$ (with x being between 1 and 3, with y being between 1 and 3, and with x+y being equal to 4), $O_2$, Ar, He, a combination thereof, or the like. In some embodiments, the patterning process further removes a portion of the dummy gate 64A and portions of the gate seal spacers 66. In such embodiments, the trench 78 extends below a bottom surface of the hard mask layer 76. In some embodiments, the trench 78 has sloped sidewalls, such that a width of the trench 78 decreases as the trench 78 extends toward the dummy gate 64A. In some embodiments, the trench 78 has a width W1 at a top surface of the hard mask layer 76 and a depth D1 as measured from the top surface of the hard mask layer 76. In some embodiments, the width W1 is between about 26 nm and about 30 nm. In some embodiments, the depth D1 is between about 35 nm and about 50 nm. In some embodiments, a ratio of D1/W1 is between about 1.17 and about 1.92.

Figure 14A:
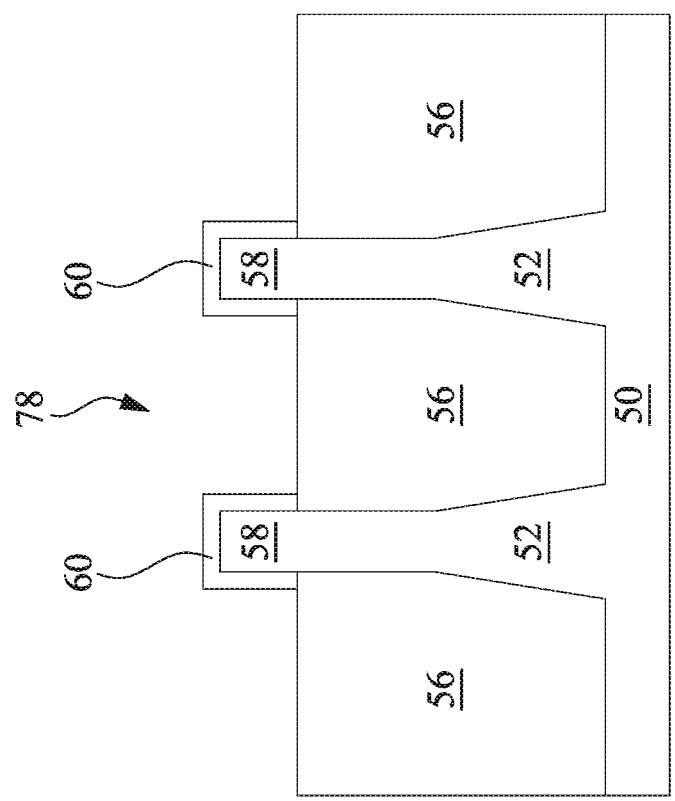
Figure 14B:
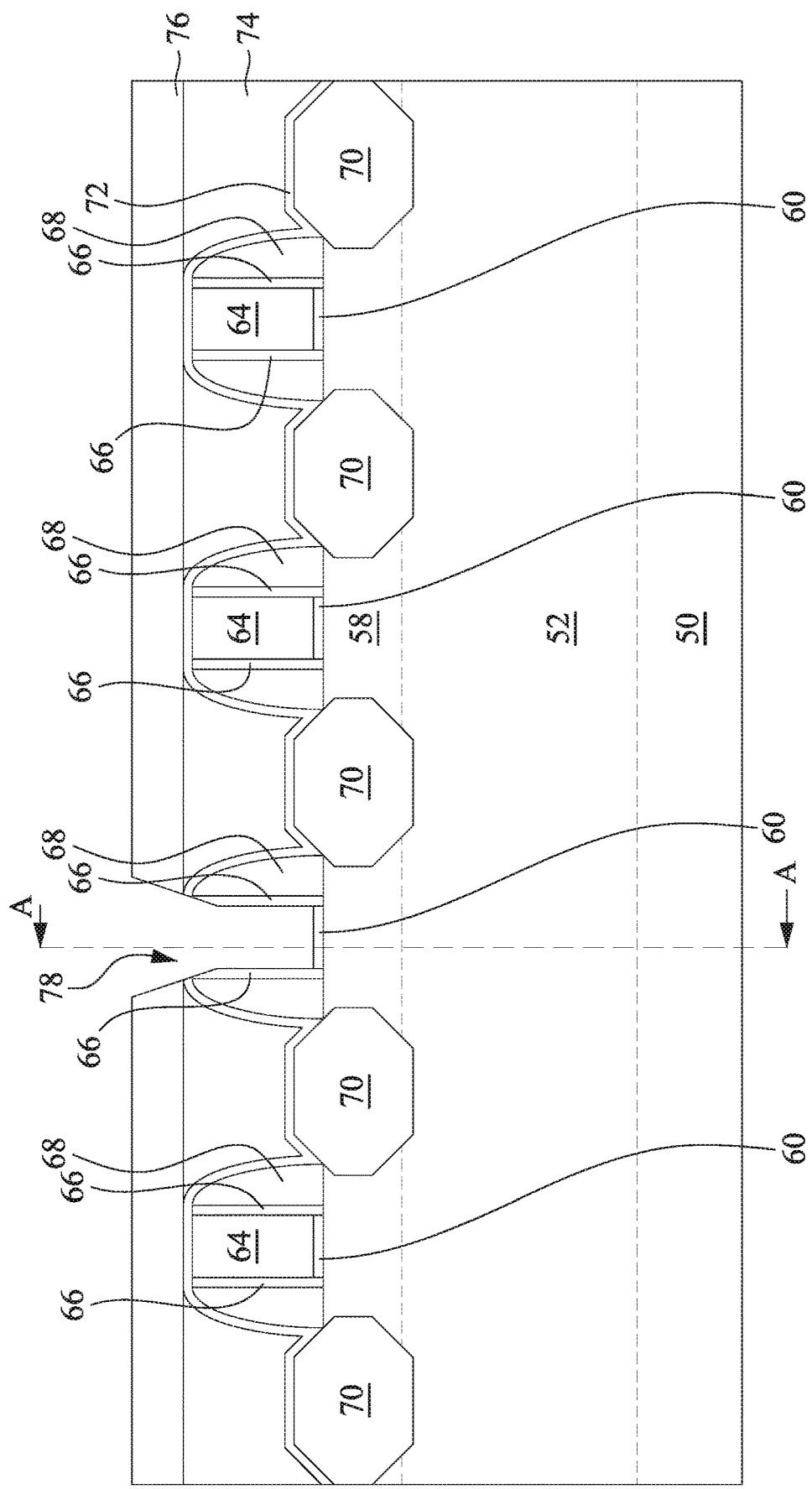

In FIGS. 14A and 14B, the dummy gate 64A exposed by the trench 78 (see FIG. 13B) is removed, such that the trench 78 is extended toward the substrate 50 and exposes the dummy dielectric layer 60. In some embodiments, the dummy gate 64A is removed by a suitable etching process. For example, the etching process may include a dry etch process using etchant gas(es) that selectively etch the material of the dummy gate 64A without etching the gate seal spacers 66 and the dummy dielectric layer 60. In some embodiments, the etchant gases may comprise $CF_4$, Ar, HBr, $O_2$, He, $NF_3$, $H_2$, a combination thereof, or the like. The dummy dielectric layer 60 may be used as an etch stop layer when the dummy gate 64A is etched. In some embodiments, the etching process for removing the dummy gate 64A may also etch the hard mask layer 76, such that a thickness of the hard mask layer 76 is reduced.

Figure 15A:
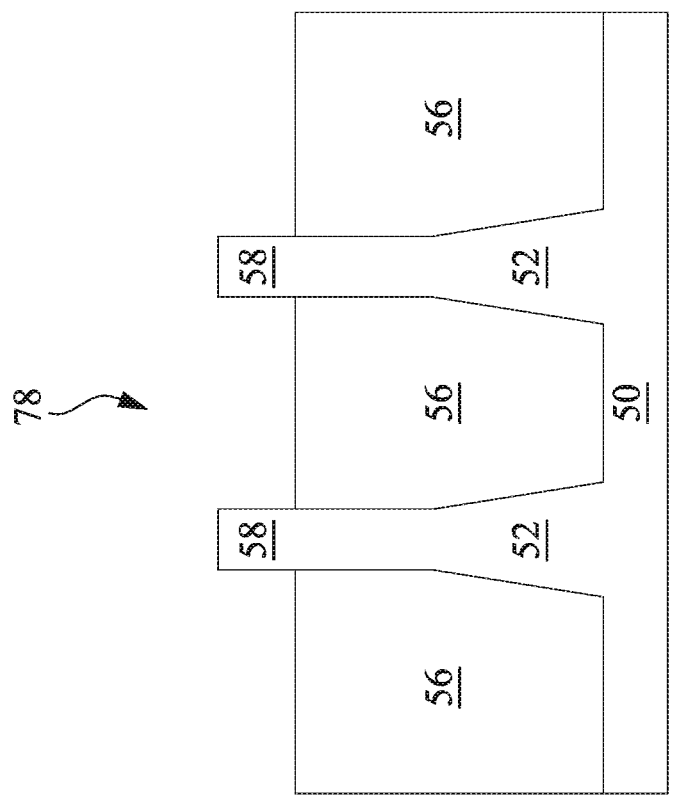
Figure 15B:
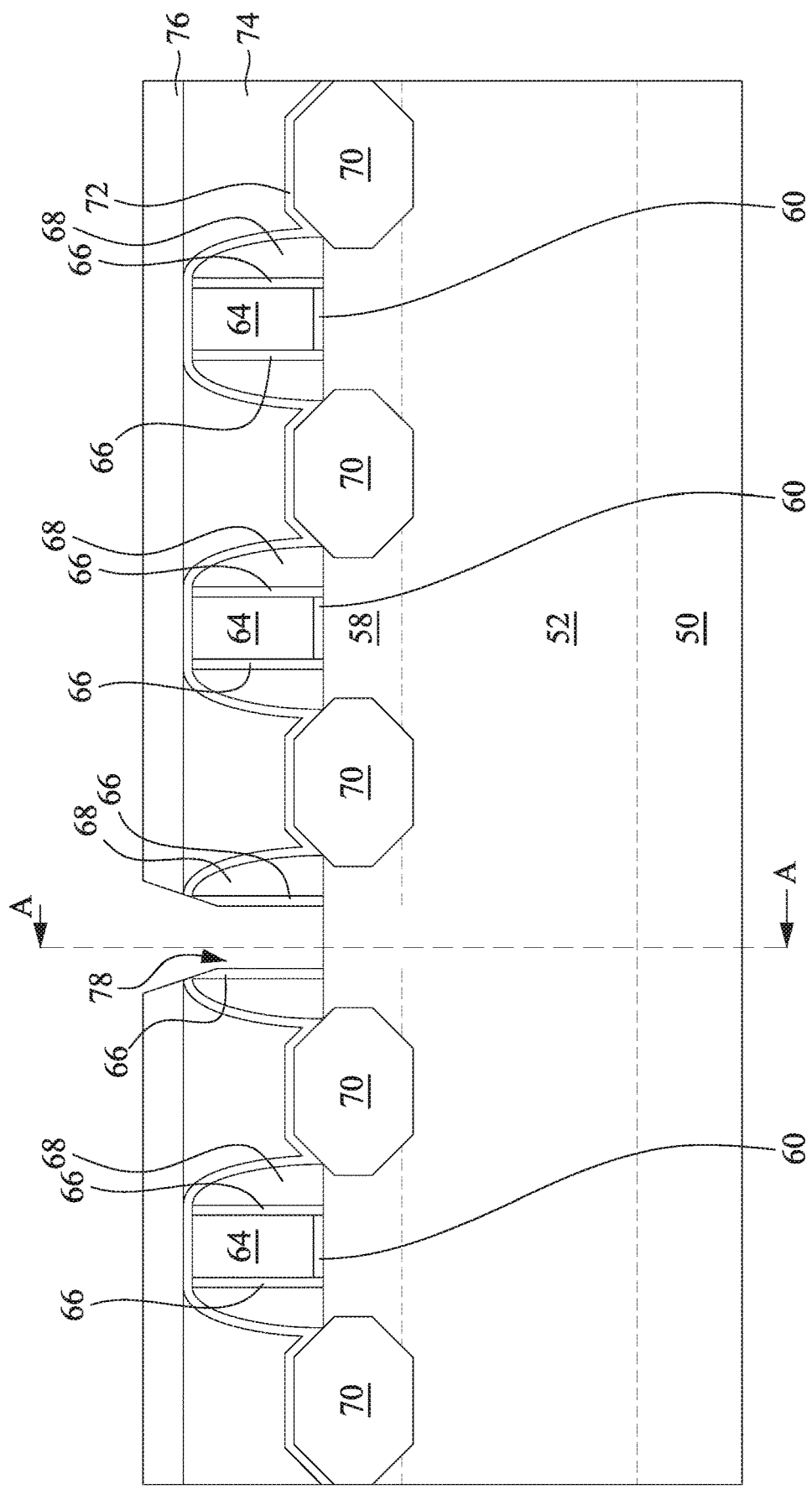

In FIGS. 15A and 15B, after removing the dummy gate 64A (see FIGS. 13A and 13B), the dummy dielectric layer 60 is removed. In some embodiments, the dummy dielectric layer 60 may be removed using one or more suitable etching processes that selectively etch the dummy dielectric layer 60 without etching the gate seal spacers 66 and the fins 52. The suitable etching processes may be one or more dry etching process, one or more wet etching process, combinations thereof, or the like. In some embodiments, etchants used for etching the dummy dielectric layer 60 may comprise $CF_4$, Ar, He, a combination thereof, or the like. In some embodiments, the etching process for removing the dummy dielectric 60 may also etch the hard mask layer 76, such that a thickness of the hard mask layer 76 is further reduced.

Figure 16A:
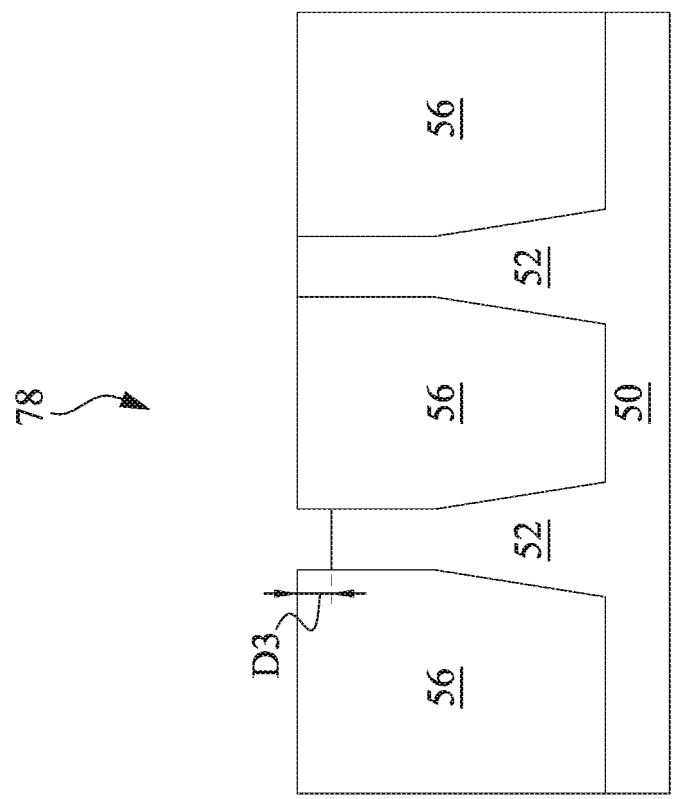
Figure 16B:
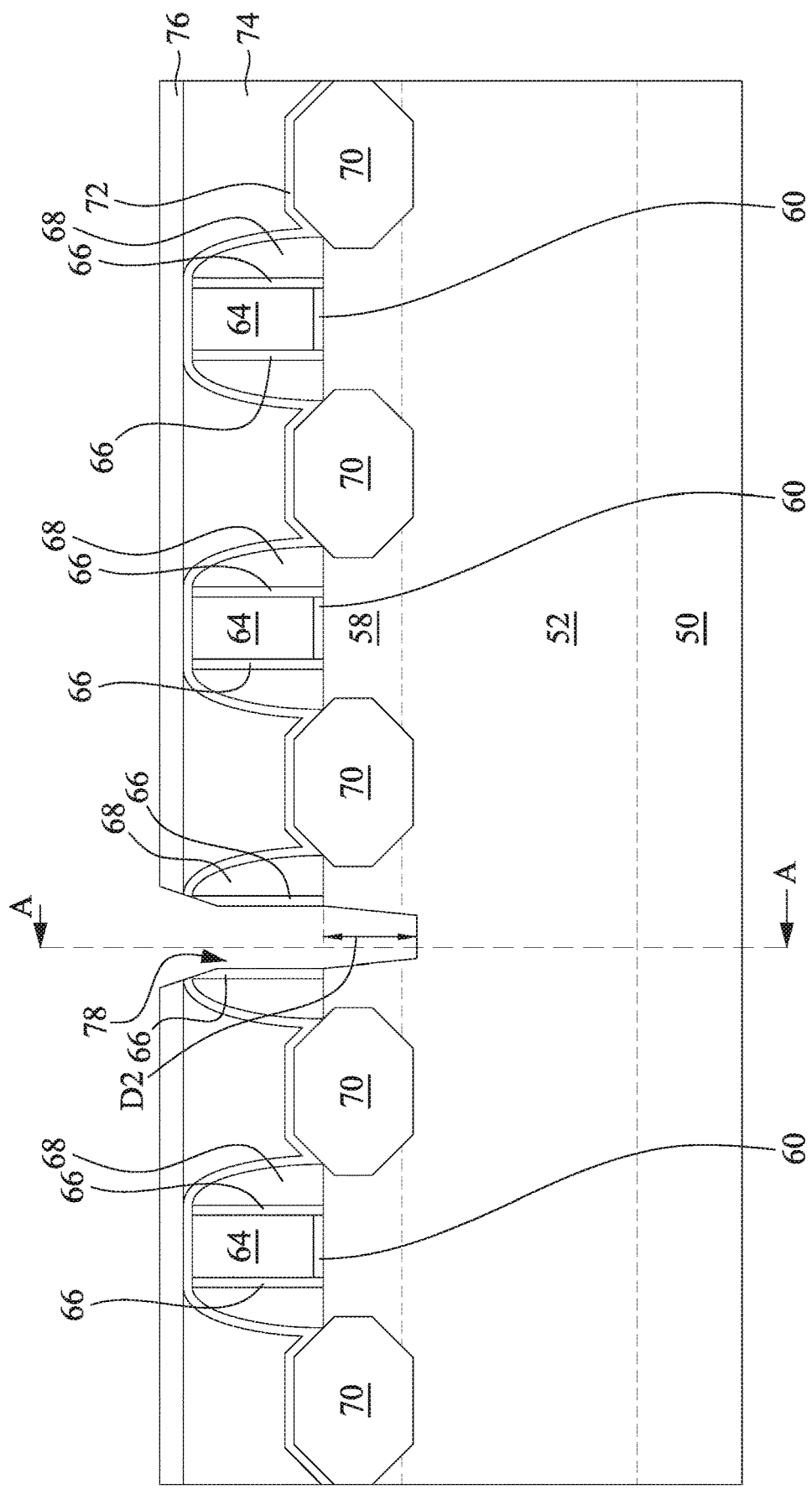

In FIGS. 16A and 16B, after removing the dummy dielectric layer 60, exposed portions of the channel regions 58 of the fins 52 are removed, such that the trench 78 is extended toward the substrate 50. In some embodiments, the exposed portions of the channel regions 58 of the fins 52 may be removed using one or more suitable etching processes that selectively etch the material of the fins 52 without etching the gate seal spacers 66 and the STI regions 56. In some embodiments, the exposed portions of the channel regions 58 of the fins 52 are removed by an anisotropic dry etch process. In some embodiments, the anisotropic dry etch process is performed using etchant gases such as $Si_xCl_y$, $O_2$, HBr, Ar, He, a combination thereof, or the like. In some embodiments, after removing the exposed portions of the channel regions 58 of the fins 52, the trench 78 has a depth D2 as measured from a top surface of the fins 52 and a depth D3 as measured from a top surface of the STI regions 56. In some embodiments, the depth D2 is between about 20 nm and about 30 nm. In some embodiments, the depth D3 is between about 15 nm and about 25 nm. In some embodiments, the etching process for removing the exposed portions of the channel regions 58 of the fins 52 may also etch the hard mask layer 76, such that a thickness of the hard mask layer 76 is further reduced.

Figure 17A:
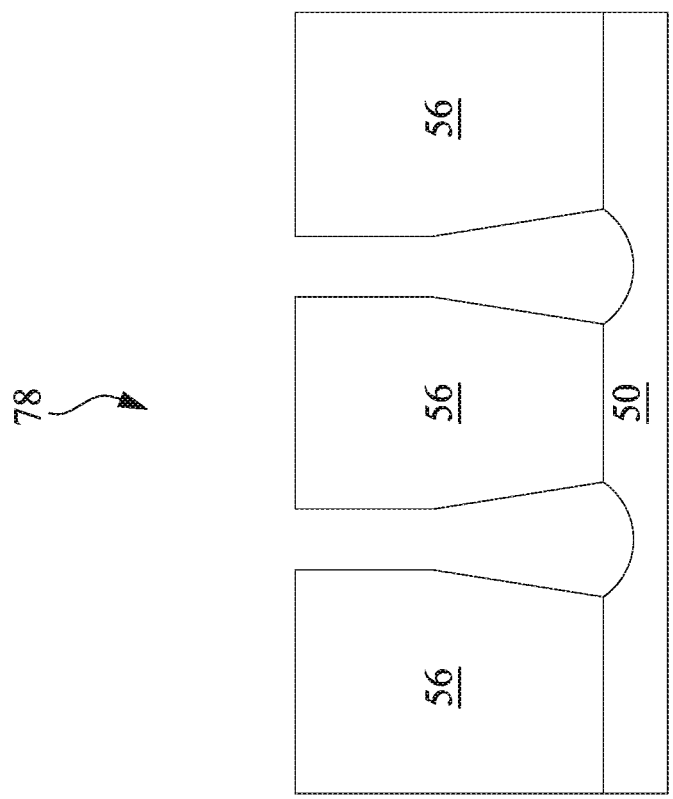
Figure 17B:
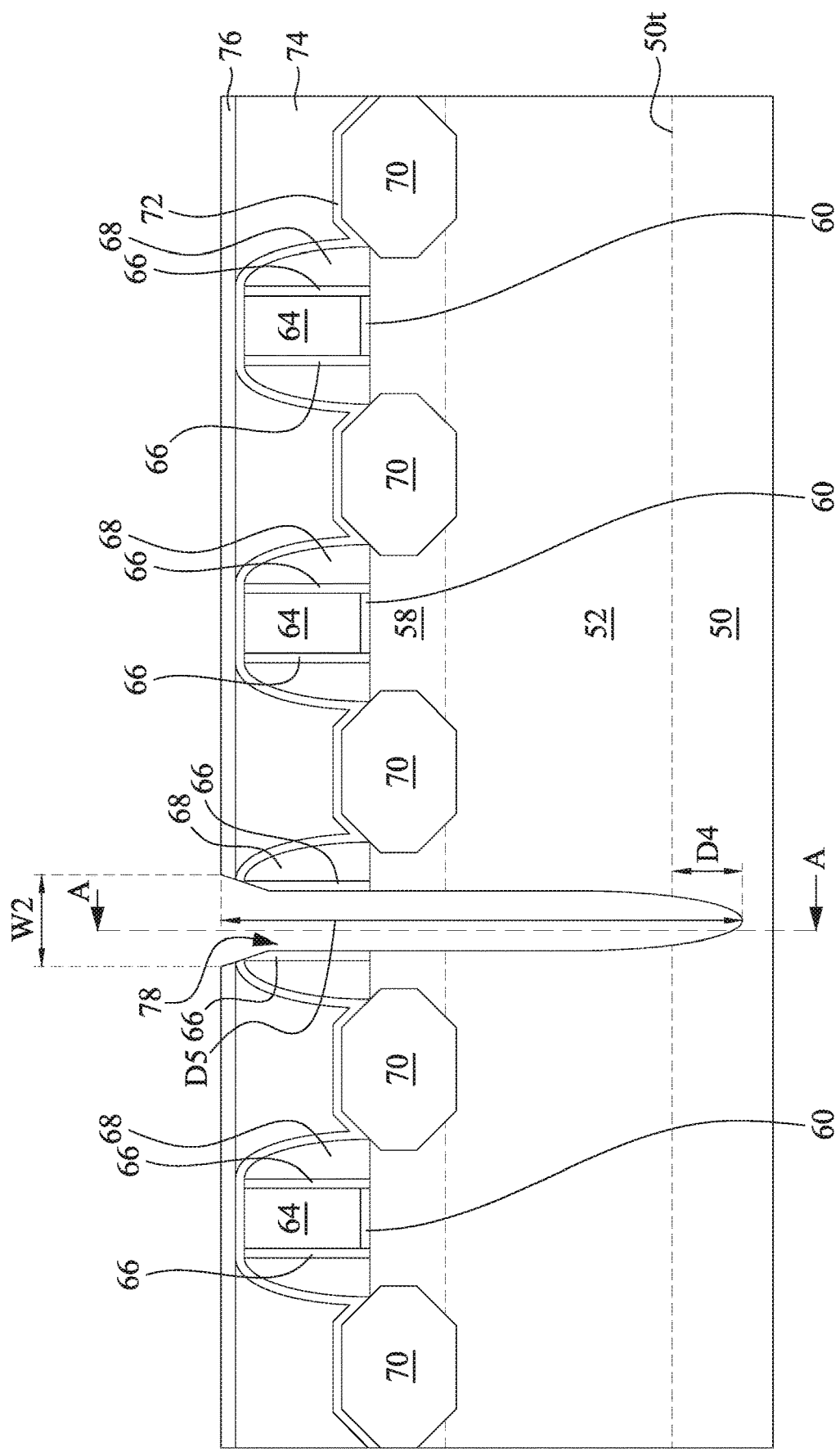

In FIGS. 17A and 17B, after removing the exposed portions of the channel regions 58 of the fins 52, exposed portions of the fins 52 and portions of the substrate 50 below the exposed portions of the fins 52 are removed, such that the trench 78 is extended into the substrate 50. In some embodiments, the removal process may comprise one or more suitable etching processes that selectively etch the material of the fins 52 without etching the gate seal spacers 66 and the STI regions 56. In some embodiments, the suitable etching processes may comprise an anisotropic dry etch process. In some embodiments, the anisotropic dry etch process is performed using etchant gases such as $O_2$, HBr, Ar, He, a combination thereof, or the like. In some embodiments, after removing the exposed portions of the fins 52 and the portions of the substrate 50 below the exposed portions of the fins 52, the trench 78 has a depth D4 as measured from the upper surface 50t of the substrate 50, a depth D5 as measured from the top surface of the hard mask layer 76, and a width W2 at the top surface of the hard mask layer 76. In some embodiments, the depth D4 is between about 30 nm and about 50 nm. In some embodiments, the depth D5 is between about 250 nm and about 300 nm. In some embodiments, the width W2 is between about 22 nm and about 26 nm. In some embodiments, an aspect ratio of the trench 78, defined as a ratio of the depth D5 to the width W2 (D5/W2), is between about 9.62 and about 13.6. In some embodiments, the etching process for removing the exposed portions of the fins 52 and the portions of the substrate 50 below the exposed portions of the fins 52 may also etch the hard mask layer 76, such that a thickness of the hard mask layer 76 is further reduced.

Further in FIGS. 17A and 17B, the trench 78 cuts each of the fins 52 into two disconnected portions. As described below in greater detail, the trench 78 is filled with one or more dielectric materials to electrically isolate the disconnected portions of the fins 52. Accordingly, devices formed from the disconnected portions of the fins 52 are also electrically isolated.

Figure 18A:
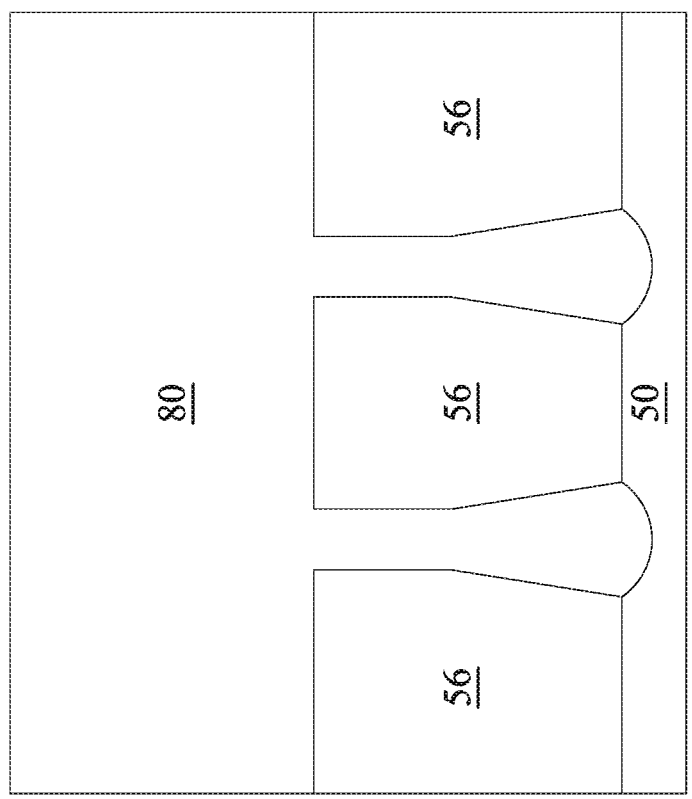
Figure 18B:
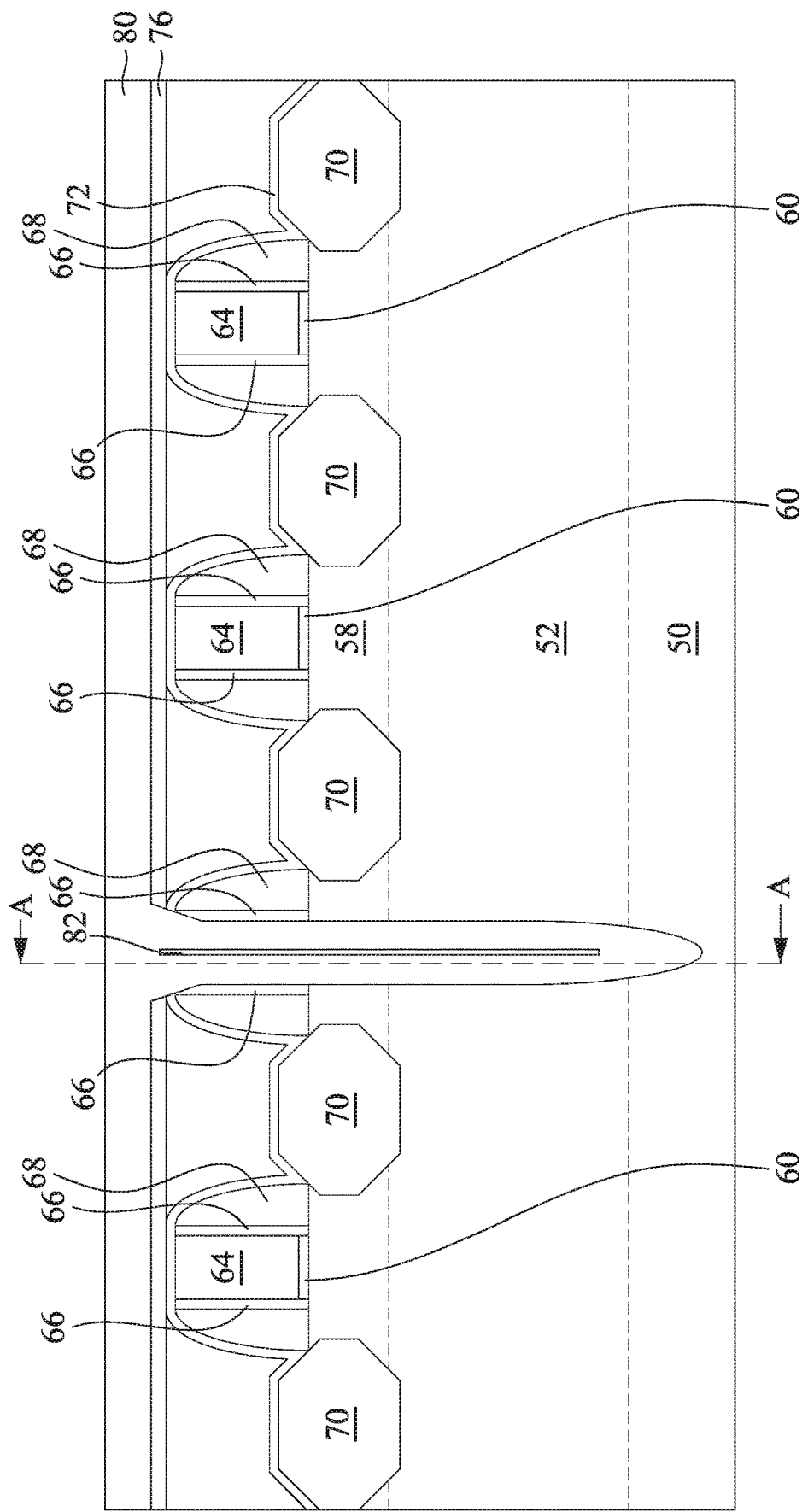

FIGS. 18A, 18B, 19A, 19B, 20A, 20B, 21A, and 21B illustrate a dielectric gap filling process performed on the trench 78 (see FIGS. 17A and 17B) in accordance with some embodiments. In FIGS. 18A and 18B, a dielectric material 80 is deposited in the trench 78 (see FIG. 17B) and over the hard mask layer 76. In some embodiments, the dielectric material 80 comprises an oxide material (such as silicon oxide, or the like), a nitride material (such as silicon nitride, or the like), an oxynitride material (such as silicon oxynitride, or the like), a combination thereof, or the like, and may be formed using ALD, CVD, PECVD, a combination thereof, or the like. In some embodiments, due to a high aspect ratio of the trench 78, a seam 82 or void (not shown) may be formed in the dielectric material 80 within the trench 78. In some embodiments, the seam 82 extends below the top surface of the fins 52.

Figure 19A:
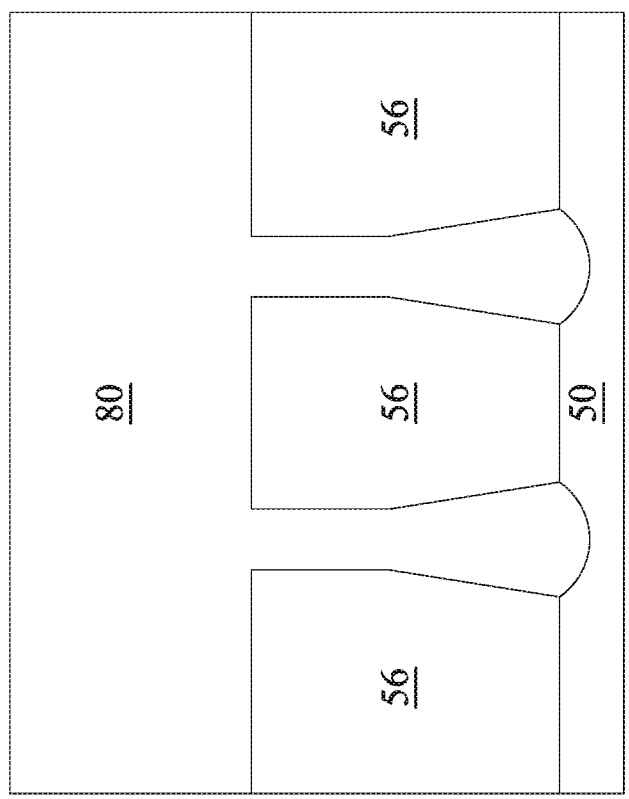
Figure 19B:
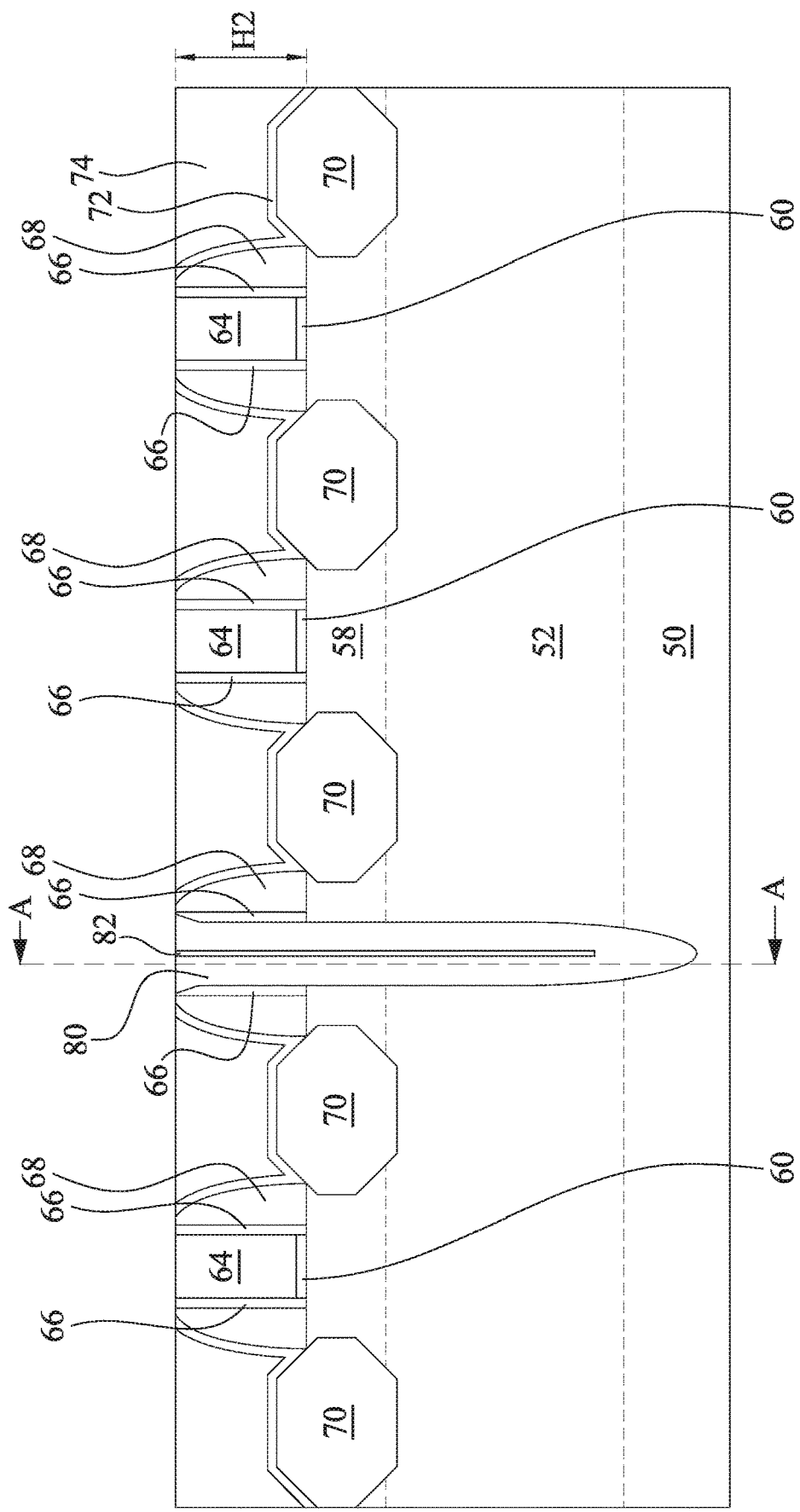

In FIGS. 19A and 19B, in some embodiments, a planarization process is performed on the dielectric material 80. The planarization process may comprise a CMP process, an etch back process, a combination thereof, or the like. In some embodiments, the planarization process exposes the dummy gates 64, such that a top surface of the dielectric material 80, top surfaces of the dummy gates 64 and the top surface of the ILD layer 74 are substantially level (within process variations) after the planarization process is completed. In such embodiments, the planarization process removes the hard mask layer 76 and portions of the ESL 72 over the dummy gates 64. In some embodiments, the planarization process further removed portions of the dummy gates 64, the gate seal spacers 66, the gate spacers 68, and the ILD 74. In such embodiments, after performing the planarization process, the dummy gates 64 have top surfaces, which are disposed above the fins 52 at a height H2 as measured from the top surfaces of the fins 52. In some embodiments, the height H2 is less than the height H1 (see FIG. 8B). In some embodiments, the height H2 is between about 80 nm and about 90 nm.

Figure 20A:
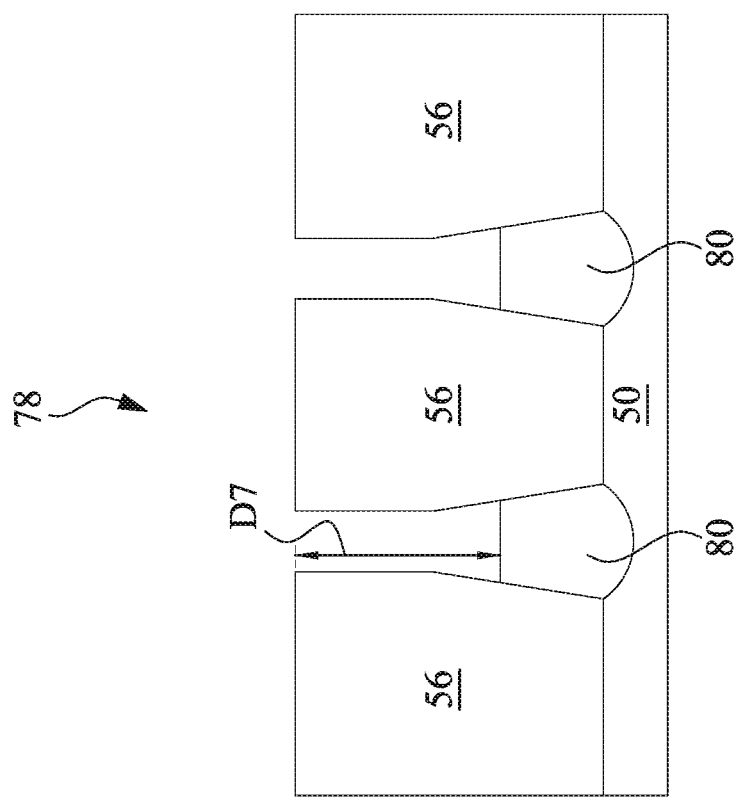
Figure 20B:
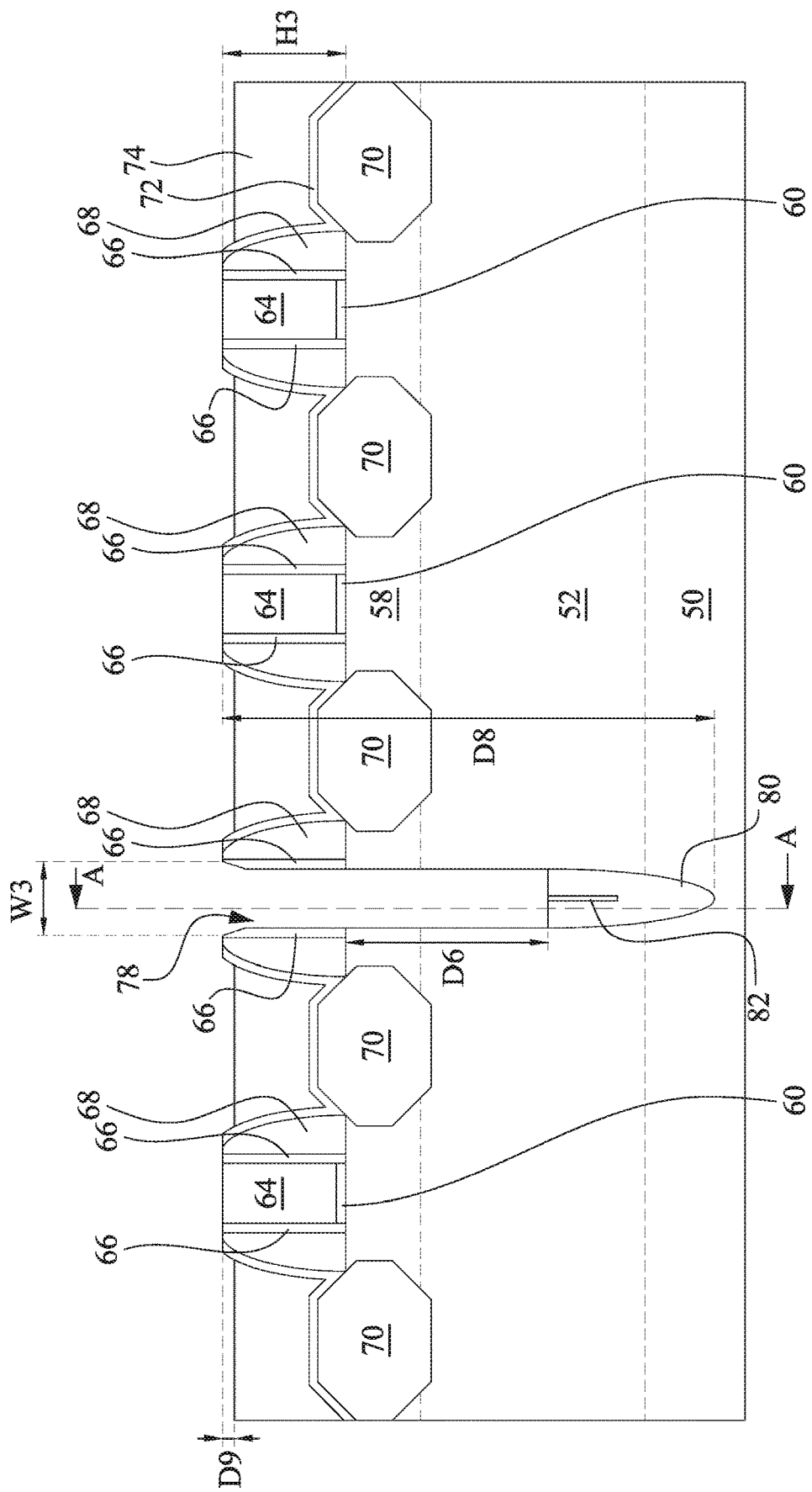

In FIGS. 20A and 20B, in some embodiments, the dielectric material 80 is recessed below the top surfaces of the fins 52. In the illustrated embodiment, after recessing the dielectric material 80, a top surface of the dielectric material 80 is below a bottom surface of the adjacent epitaxial source/drain regions 70. In other embodiments, the top surface of the dielectric material 80 may be above the bottom surface of the adjacent epitaxial source/drain regions 70. In some embodiments, the dielectric material 80 is recessed below the top surface of the fin 52 to a depth D6. In some embodiments, the depth D6 is between about 150 nm and about 170 nm. In some embodiments, the dielectric material 80 is recessed below the top surface of the STI regions 56 to a depth D7. In some embodiments, the depth D7 is between about 120 nm and about 150 nm. In some embodiments, the recessing process comprises a suitable etching process that selectively etches the dielectric material 80 without significantly etching the gate seal spacers 66, the dummy gates 64, the ESL 72, and the ILD 74. The suitable etching process may include a dry etch process, a wet etch process, a combination thereof, or the like. In some embodiments, the etching process for recessing the dielectric material 80 is performed using etchants such as $NF_3$, HF, $NH_3$, a combination thereof, or the like.

In some embodiments, by leaving a portion of the dielectric material 80 in the trench 78, an aspect ratio of the unfilled portion of the trench 78 is reduced. The unfilled portion of the trench 78 has a width W3 at a top of the trench 78, and a depth D8 as measured from the top surfaces of the dummy gates 64. In some embodiments, the depth D8 is between about 200 nm and about 250 nm. In some embodiments, the aspect ratio of the unfilled portion of the trench 78, defined as a ratio of the depth D8 to the width W3 (D8/W3), is between about 9 and about 12. In some embodiments, the recessing process of the dielectric material 80 may also recess the ILD 74, such that the top surface of the ILD 74 is below the top surfaces of the dummy gates 64. In some embodiments, the ILD 74 is recessed below the top surfaces of the dummy gates 64 to a depth D9. In some embodiments, the depth D9 is between about 15 nm and about 30 nm.

In some embodiments, the recessing process also removes portions of the dummy gates 64, the gate seal spacers 66, the gate spacers 68, and the ESL 72. In such embodiments, after performing the recessing process, the dummy gates 64 have top surfaces, which are disposed above the fins 52 at a height H3 as measured from the top surfaces of the fins 52. In some embodiments, the height H3 is less than the height H2 (see FIG. 19B). In some embodiments, the height H3 is between about 70 nm and about 75 nm.

Figure 21A:
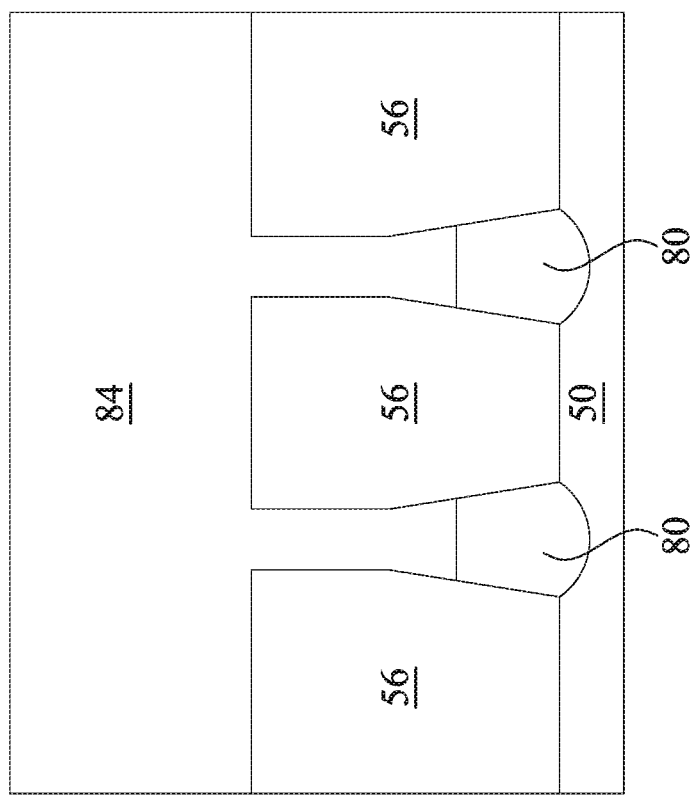
Figure 21B:
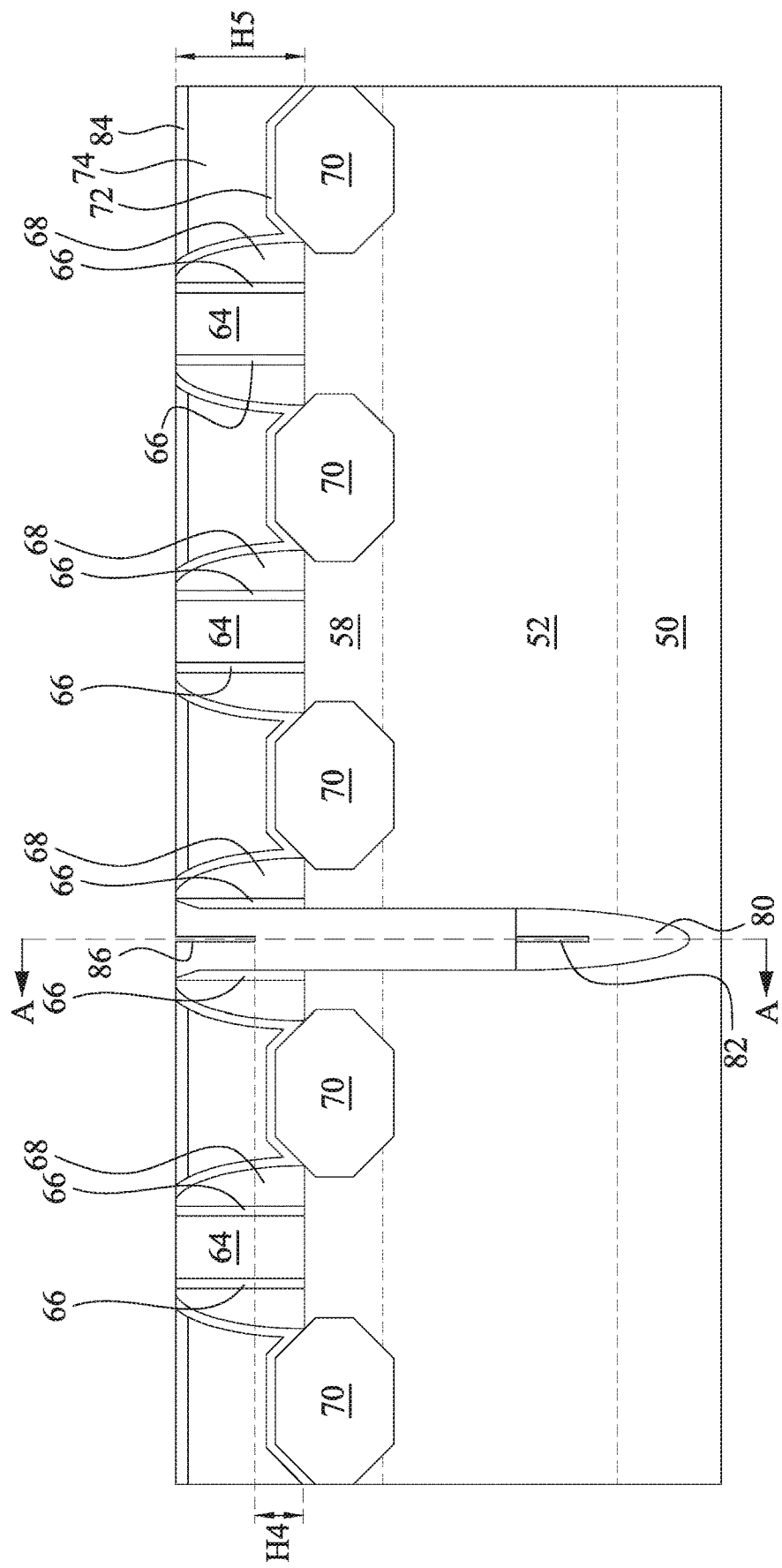

In FIGS. 21A and 21B, a dielectric material 84 is deposited in the trench 78 (see FIG. 20B), and over the ILD 74 and the dummy gates 64. In some embodiments, the dielectric material 84 comprises an oxide material (such as silicon oxide, or the like), a nitride material (such as silicon nitride, or the like), an oxynitride material (such as silicon oxynitride, or the like), a combination thereof, or the like, and may be formed using ALD, CVD, a combination thereof, or the like. In some embodiments, the dielectric material 80 and the dielectric material 84 comprise different materials. In other embodiments, the dielectric material 80 and the dielectric material 84 comprise a same material. In some embodiments, by reducing the aspect ratio of the unfilled portion of the trench 78 as described above with reference to FIGS. 20A and 20B, formation of a seam or void within the trench 78 may be reduced. In some embodiments, by reducing the aspect ratio (D8/W3) of the unfilled portion of the trench 78 to be between about 9 and about 12, a seam 86 may be formed in the dielectric material 84 within the trench 78 (see FIGS. 20B), such that the seam 86 does not extend below the top surfaces of the fins 52. In some embodiments, a bottommost portion of the seam 86 is disposed above the fins 52 at a height H4 as measured from the top surfaces of the fins 52. In some embodiments, the height H4 is between about 20 nm and about 35 nm.

In some embodiments, a planarization process is performed on the dielectric material 84. The planarization process may comprise a CMP process, an etch back process, a combination thereof, or the like. The planarization process exposes the dummy gates 64 such that top surfaces of the dummy gates 64 and the top surface of the dielectric material 84 are substantially level (within process variations) after the planarization process is completed. Portions of the dielectric materials 80 and 84 disposed within the trench 78 (see FIG. 20B) may be also referred to as an isolation structure. In some embodiments, the planarization process also removes portions of the dummy gates 64, the gate seal spacers 66, the gate spacers 68, and the ESL 72. In such embodiments, after performing the planarization process, the dummy gates 64 have top surfaces, which are disposed above the fins 52 at a height H5 as measured from the top surfaces of the fins 52. In some embodiments, the height H5 is less than the height H3 (see FIG. 20B). In some embodiments, the height H5 is between about 50 nm and about 65 nm.

Figure 22A:
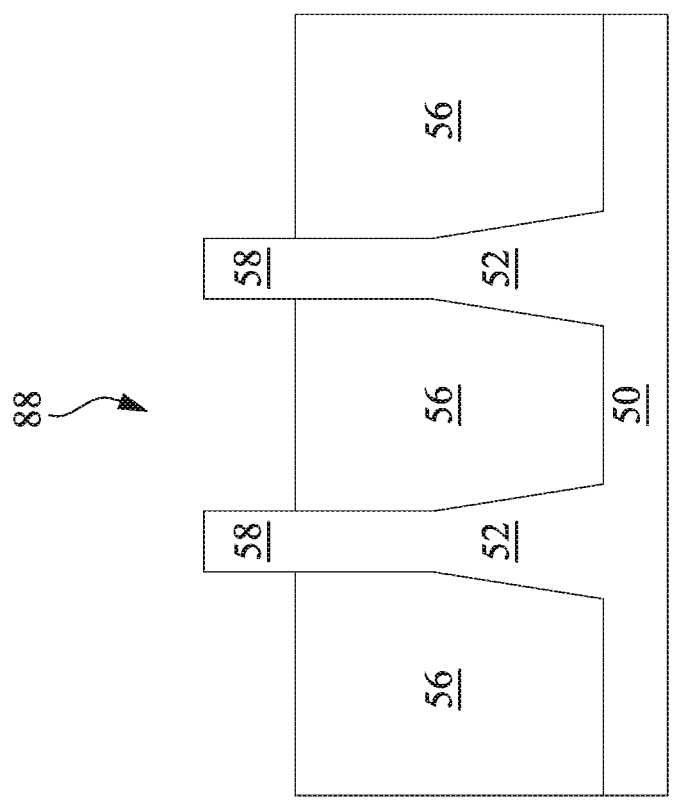
Figure 22B:
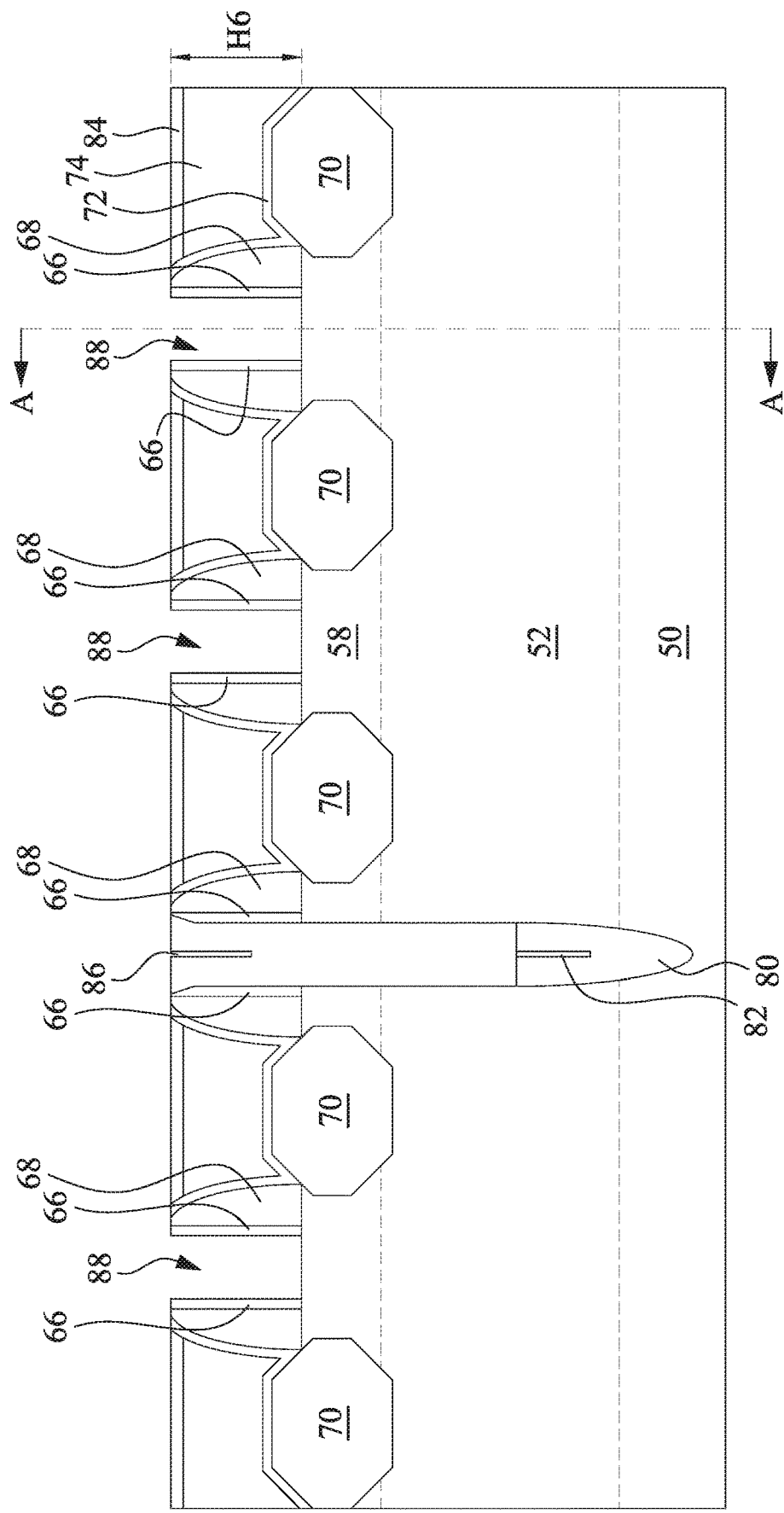

In FIGS. 22A and 22B, the dummy gates 64 and corresponding dummy dielectric layers 60 (see FIGS. 21A and 21B) are removed in one or more etching steps, so that openings 88 are formed. In some embodiments, the dummy gates 64 are removed by a suitable etching process. For example, the etching process may include a dry etch process using reaction gas(es) that selectively etch the dummy gates 64 without etching the ILD 74 or the gate spacers 68. The etching process may be anisotropic. Each opening 88 exposes channel regions 58 of respective fins 52. Each channel region 58 is disposed between neighboring pairs of the epitaxial source/drain regions 70. During the removal, the dummy dielectric layers 60 may be used as an etch stop layer when the dummy gates 64 are etched. Subsequently, the dummy dielectric layers 60 are removed by a suitable etching process.

In some embodiments, the processes for removing the dummy gates 64 and the dummy dielectric layers 60 may also remove portions of the dielectric material 84, the gate seal spacers 66, the gate spacers 68, and the ESL 72. In such embodiments, a thickness of the dielectric material 84 over the ILD 74 is reduced, such that a top surface of the dielectric material 84 is disposed above the fins 52 at a height H6 as measured from the top surfaces of the fins 52. In some embodiments, the height H6 is less than the height H5 (see FIG. 21B). In some embodiments, the height H6 is between about 50 nm and about 60 nm.

Figure 23A:
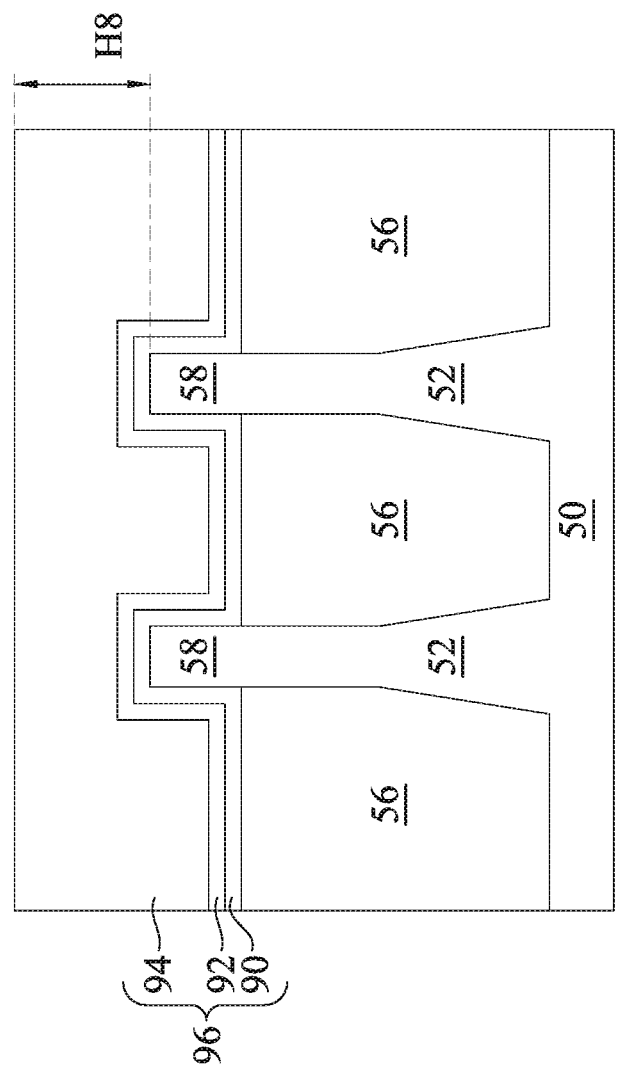
Figure 23B:
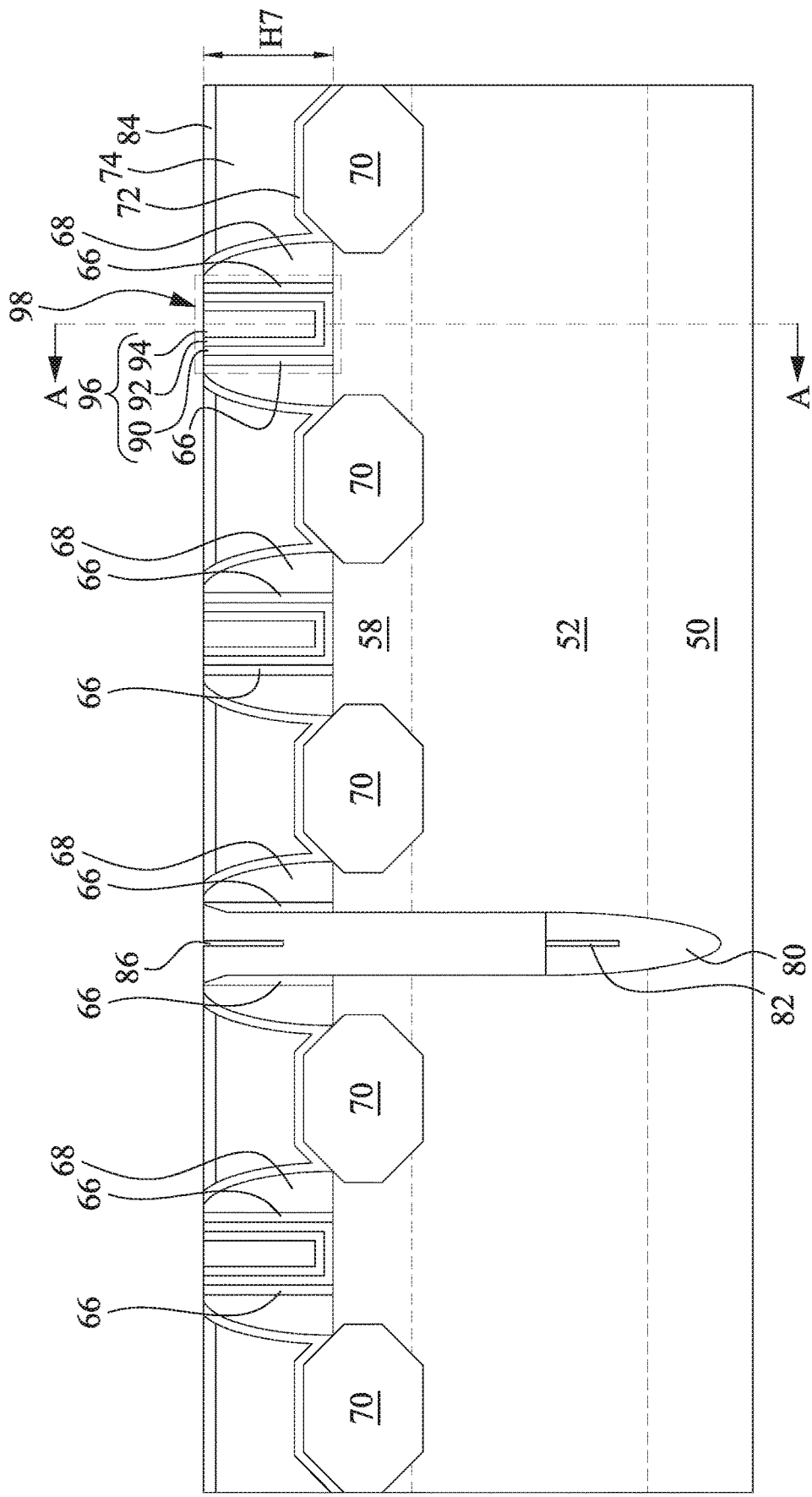
Figure 23C:
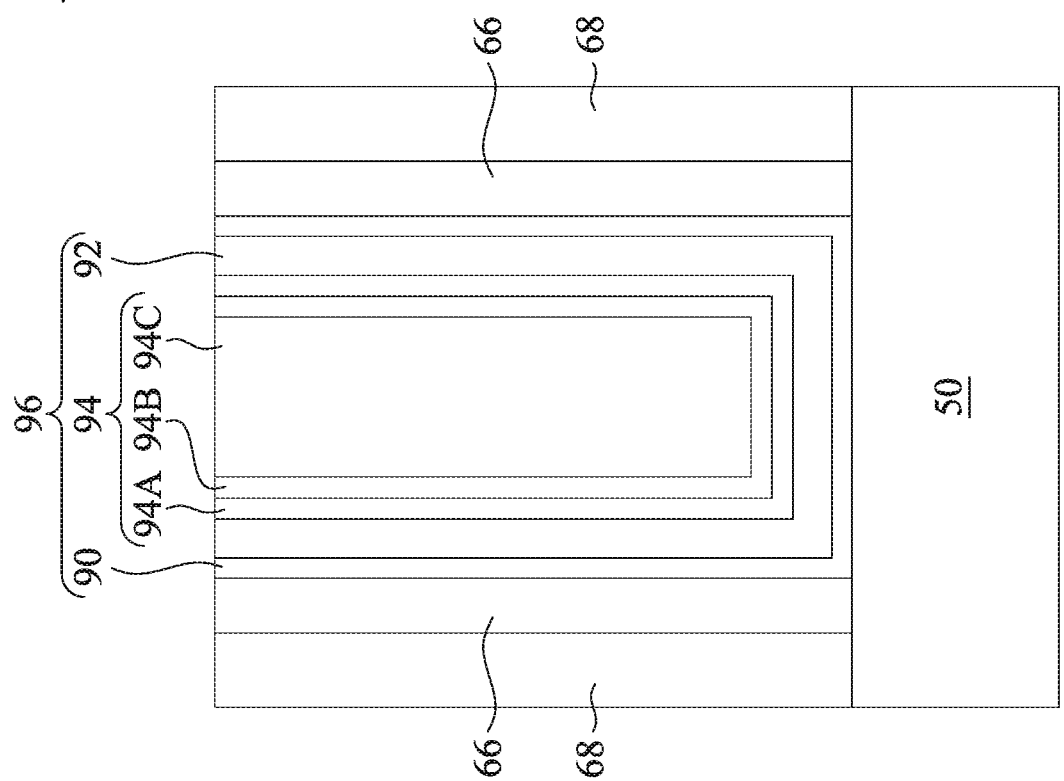

In FIGS. 23A and 23B, interfacial layers 90, gate dielectric layers 92 and gate electrodes 94 are formed in the openings 88 (see FIGS. 22A and 22B) to form replacement gate stacks 96. FIG. 23C illustrates a detailed view of a region 98 of FIG. 23B. In some embodiments, the interfacial layers 90 are formed in the openings 88 (see FIGS. 22A and 22B). The interfacial layers 90 may comprise silicon oxide and may be formed using a chemical deposition process, such as ALD, CVD, PECVD, or the like, or using an oxidation process. In some embodiments where the interfacial layers 90 are formed using a deposition process, the interfacial layers 90 extend along exposed surfaces of the fins 52, the STI regions 56, and the gate seal spacers 66. In some embodiments where the interfacial layers 90 are formed using an oxidation process, the interfacial layers 90 extend along exposed surfaces of the fins 52, and do not extend along exposed surfaces of the STI regions 56 and the gate seal spacers 66.

In some embodiments, the gate dielectric layers 92 are deposited over the interfacial layers 90 in the openings 88 (see FIGS. 22A and 22B). In some embodiments, the gate dielectric layers 92 may comprise silicon oxide, silicon nitride, or multilayers thereof, or the like. In some embodiments, the gate dielectric layers 92 may include a high-k dielectric material, and in these embodiments, the gate dielectric layers 92 may have a k value greater than about 7.0, and may include a metal oxide or a silicate of hafnium, aluminum, zirconium, lanthanum, manganese, barium, titanium, lead, and combinations thereof, or the like. The gate dielectric layers 92 may be formed using ALD, CVD, or the like.

Further in FIGS. 23A and 23B, the gate electrodes 94 are deposited over the gate dielectric layers 92 and fill the remaining portions of the openings 88 (see FIGS. 22A and 22B). Although single layer gate electrodes 94 are illustrated in FIG. 23B, each of the gate electrodes 94 may comprise any number of liner layers 94A, any number of work function tuning layers 94B, and a conductive fill layer 94C as illustrated by FIG. 23C. The liner layers 94A may include TiN, TiO, TaN, TaC, combinations thereof, multi-layers thereof, or the like, and may be formed using PVD, CVD, ALD, a combination thereof, or the like. In the n-type region of the substrate 50, the work function tuning layers 94B may include Ti, Ag, Al, TiAl, TiAlN, TiAlC, TaC, TaCN, TaSiN, TaAlC, Mn, Zr, combinations thereof, multi-layers thereof, or the like, and may be formed using PVD, CVD, ALD, a combination thereof, or the like. In the p-type region of the substrate 50, the work function tuning layers 94B may include TiN, WN, TaN, Ru, Co, combinations thereof, multi-layers thereof, or the like, and may be formed using PVD, CVD, ALD, a combination thereof, or the like. In some embodiments, the conductive fill layer 94C may comprise Co, Ru, Al, Ag, Au, W, Ni, Ti, Cu, Mn, Pd, Re, Ir, Pt, Zr, alloys thereof, combinations thereof, multi-layers thereof, or the like, and may be formed using PVD, CVD, ALD, a combination thereof, or the like.

After the filling of the openings 88 (see FIGS. 22A and 22B), a planarization process, such as a CMP process, may be performed to remove the excess portions of the gate dielectric layers 92, the gate electrodes 94, and/or the interfacial layers 90, which excess portions are over the top surface of the dielectric material 84. The remaining portions of the gate electrodes 94, the gate dielectric layers 92, and the interfacial layers 90 thus form replacement gate stacks 96 of the resulting FinFETs. The gate stacks 96 may extend along sidewalls of the channel regions 58 of the fins 52. In some embodiments, the planarization process may also remove portions of the dielectric material 84, the gate seal spacers 66, the gate spacers 68, and the ESL 72. In such embodiments, after performing the planarization process, the gate stacks 96 have top surfaces, which are disposed above the fins 52 at a height H7 as measured from the top surfaces of the fins 52. In some embodiments, the height H7 is less than the height H6 (see FIG. 22B). In some embodiments, the height H7 is between about 40 nm and about 50 nm.

The formation of the gate dielectric layers 92 in the n-type region and the p-type region of the substrate 50 may occur simultaneously such that the gate dielectric layers 92 in each region are formed of the same materials. In other embodiments, the gate dielectric layers 92 in each region may be formed by distinct processes such that the gate dielectric layers 92 in different regions may be formed of different materials. The formation of the conductive fill layers 94C in the n-type region and the p-type region of the substrate 50 may occur simultaneously such that the conductive fill layers 94C in each region are formed of the same materials. In other embodiments, the conductive fill layers 94C in each region may be formed by distinct processes such that the conductive fill layers 94C in different regions may be formed of different materials. Various masking steps may be used to mask and expose appropriate regions when using distinct processes.

Figure 24A:
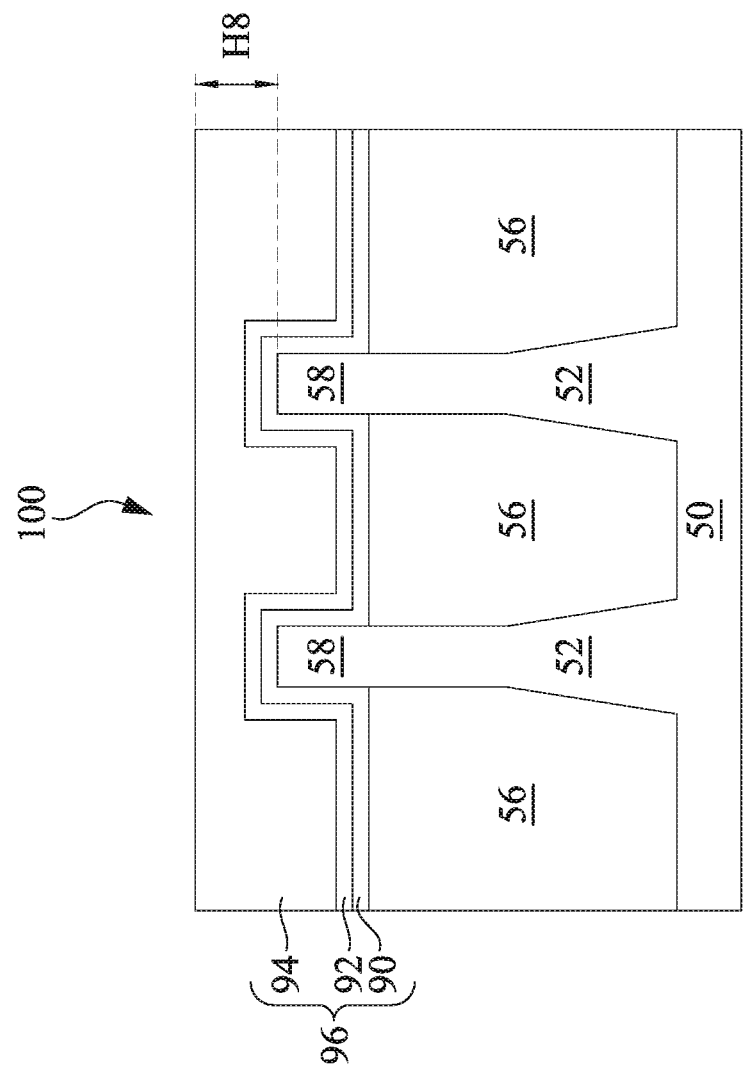
Figure 24B:
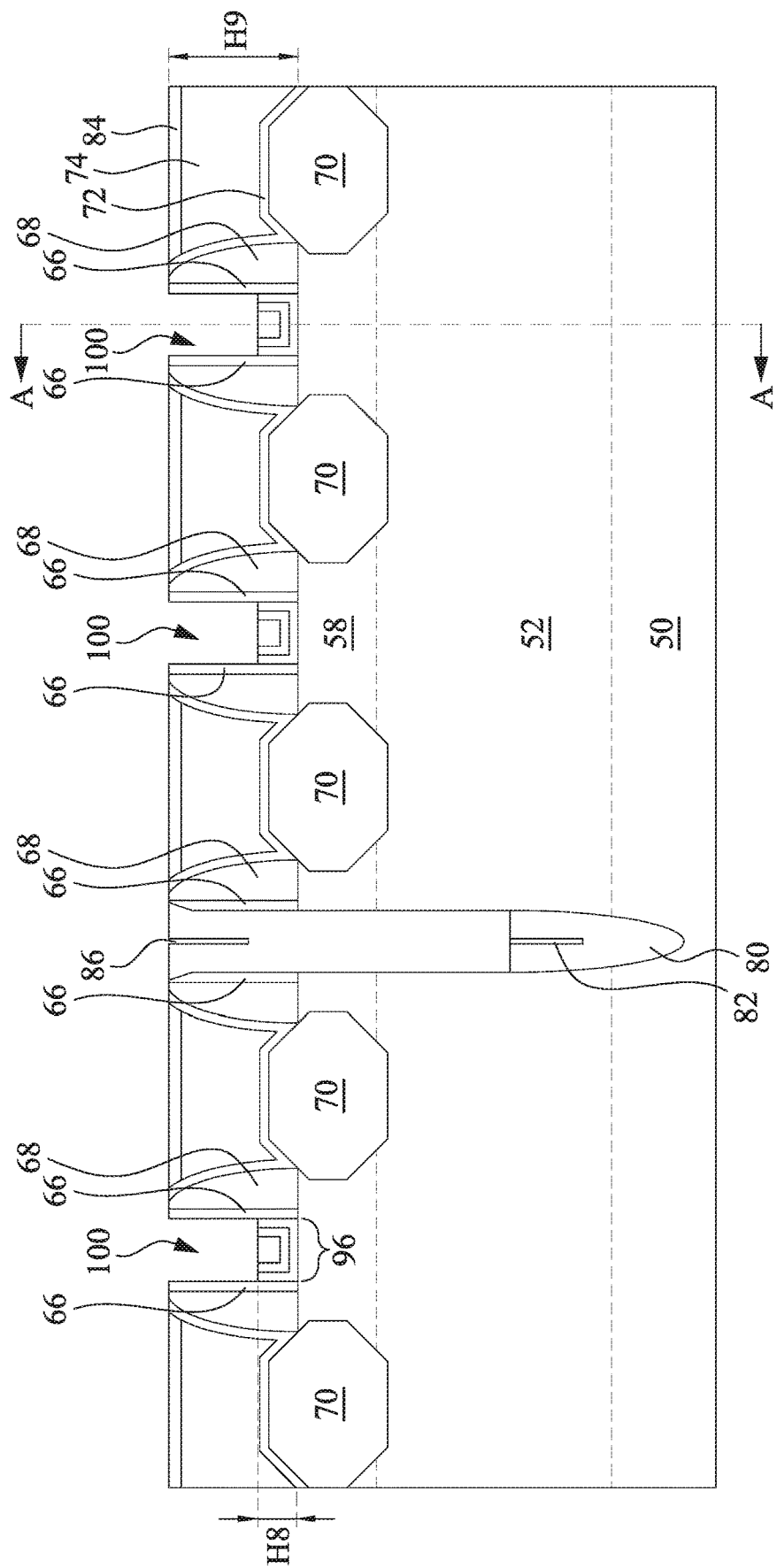

In FIGS. 24A and 24B, the gate stacks 96 are recessed, so that recesses 100 are formed directly over the gate stacks 96 and between opposing portions of the gate seal spacers 66. In some embodiments, the recessing process comprises a suitable etching process that selectively etches the materials of the gate stacks 96 without significantly etching the gate seal spacers 66. The suitable etching process may include a dry etch process, a wet etch process, a combination thereof, or the like. In some embodiments, the etching process for recessing the gate stacks 96 is performed using etchants such as $CF_4$, $CHF_3$, HBr, $N_2$, $H_2$, $O_2$, a combination thereof, or the like. In other embodiments, the etching process for recessing the gate stacks 96 is performed using etchants such as deionized (DI) water with dissolved ozone ($DIO_3$), $H_2SO_4$, $NH_4OH$, a combination thereof, or the like.

In some embodiments, after performing the recessing process, the gate stacks 96 have top surfaces, which are disposed above the fins 52 at a height H8 as measured from the top surfaces of the fins 52. In some embodiments, the height H8 is less than the height H4 (see FIG. 21B). In some embodiments, the height H8 is between about 10 nm and about 20 nm.

In some embodiments, the recessing process may also remove portions of the dielectric material 84, the gate seal spacers 66, the gate spacers 68, and the ESL 72. In such embodiments, a thickness of the dielectric material 84 over the ILD 74 is further reduced, such that a top surface of the dielectric material 84 is disposed above the fins 52 at a height H9 as measured from the top surfaces of the fins 52. In some embodiments, the height H9 is less than the height H7 (see FIG. 23B). In some embodiments, the height H9 is between about 30 nm and about 40 nm.

Figure 25A:
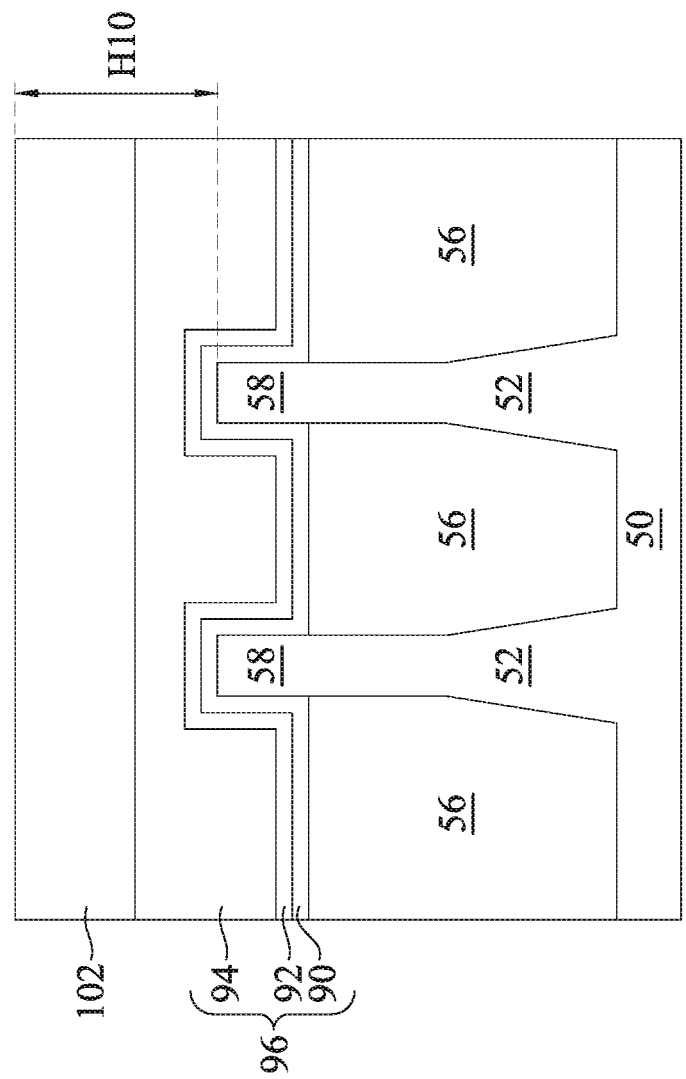
Figure 25B:
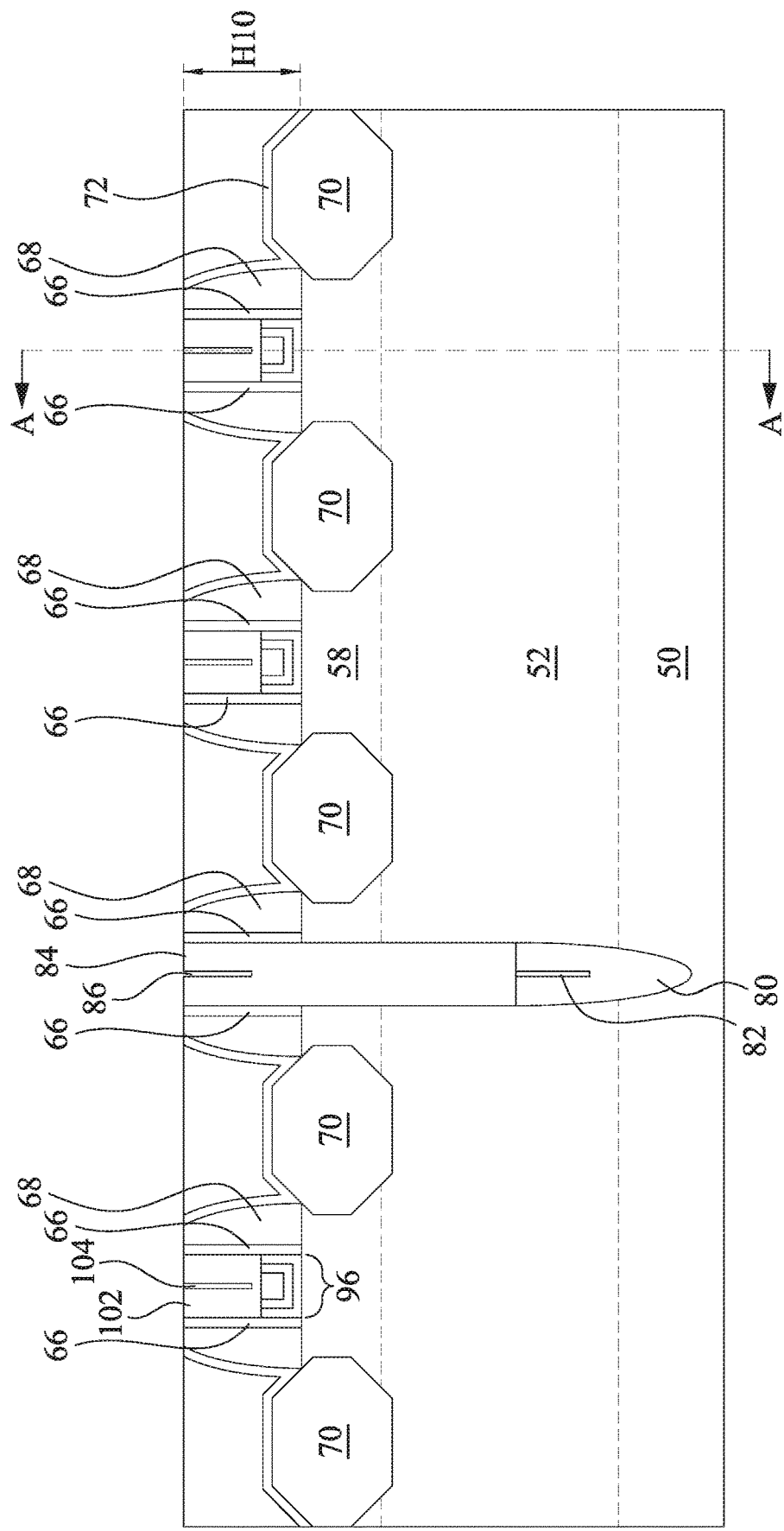

In FIGS. 25A and 25B, gate masks 102 comprising one or more layers of a dielectric material, such as silicon nitride, silicon oxynitride, a combination thereof, or the like, are filled in the recesses 100 (see FIGS. 24A and 24B), followed by a planarization process to remove excess portions of the dielectric material extending over the ILD 74. The planarization process may comprise a CMP process, an etching process, a combination thereof, or the like. In some embodiments, seams 104 may be formed in the gate masks 102 within the recesses 100 (see FIGS. 24A and 24B). In some embodiments, the planarization process may also remove portions of the ILD 74, the gate seal spacer 66, the gate spacer 68, and ESL 72. In such embodiments, after performing the planarization process, the gate masks 102 have top surfaces, which are disposed above the fins 52 at a height H10 as measured from the top surfaces of the fins 52. In some embodiments, the height H10 is less than the height H9 (see FIG. 24B). In some embodiments, the height H10 is between about 25 nm and about 35 nm.

Figure 26A:
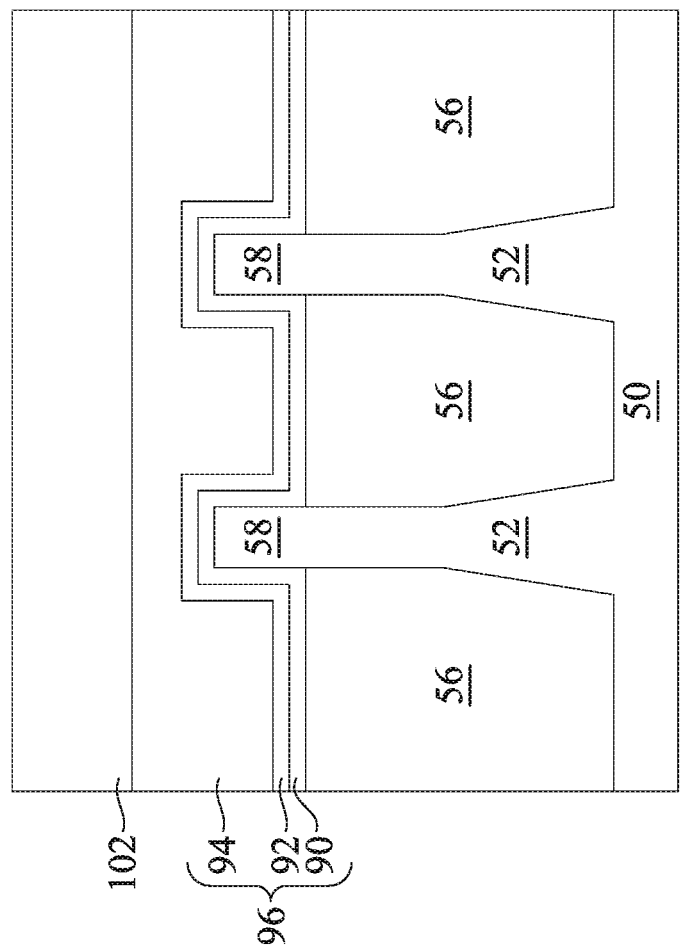
Figure 26B:
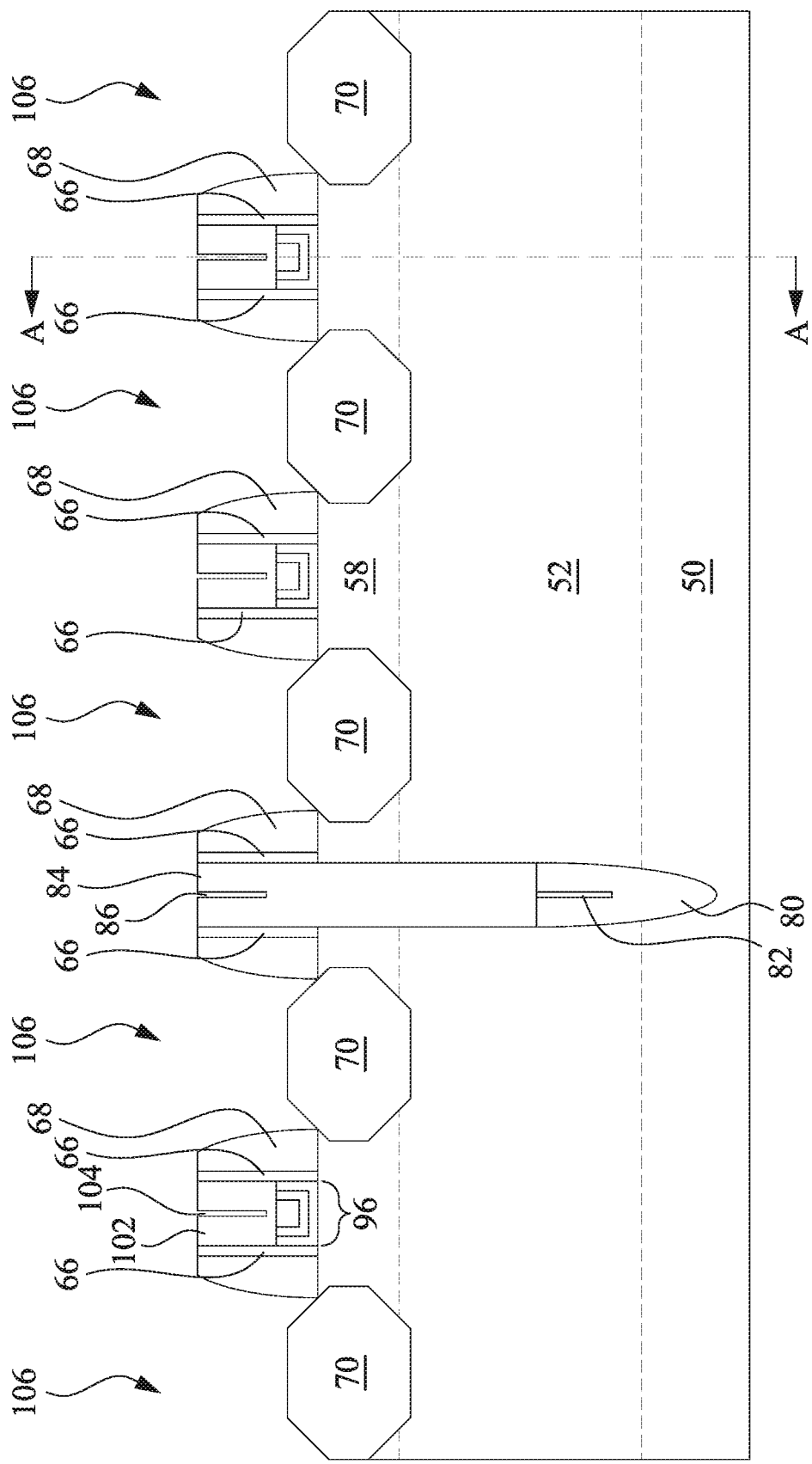

In FIGS. 26A and 26B, the ILD 74 and the ESL 72 (see FIGS. 25A and 25B) are patterned to form openings 106 exposing the epitaxial source/drain regions 70. The patterning process exposes the epitaxial source/drain regions 70 and the gate spacers 68. In some embodiments, the patterning process comprises one or more suitable etching processes that selectively etch the materials of the ILD 74 and the ESL 72. The suitable etching processes may include a dry etching process, a wet etching process, a combination thereof, or the like. In some embodiments, the patterning process comprises a first etching process for patterning the ILD 74, followed by a second etching process for patterning the ESL 72. In some embodiments, the first etching process is performed using etchants such as $C_4F_6$, $C_4F_8$, $O_2$, CO, a combination thereof, or the like. In some embodiments, the second etching process is performed using etchants such as HF, $NH_3$, $NF_3$, a combination thereof, or the like.

Figure 27A:
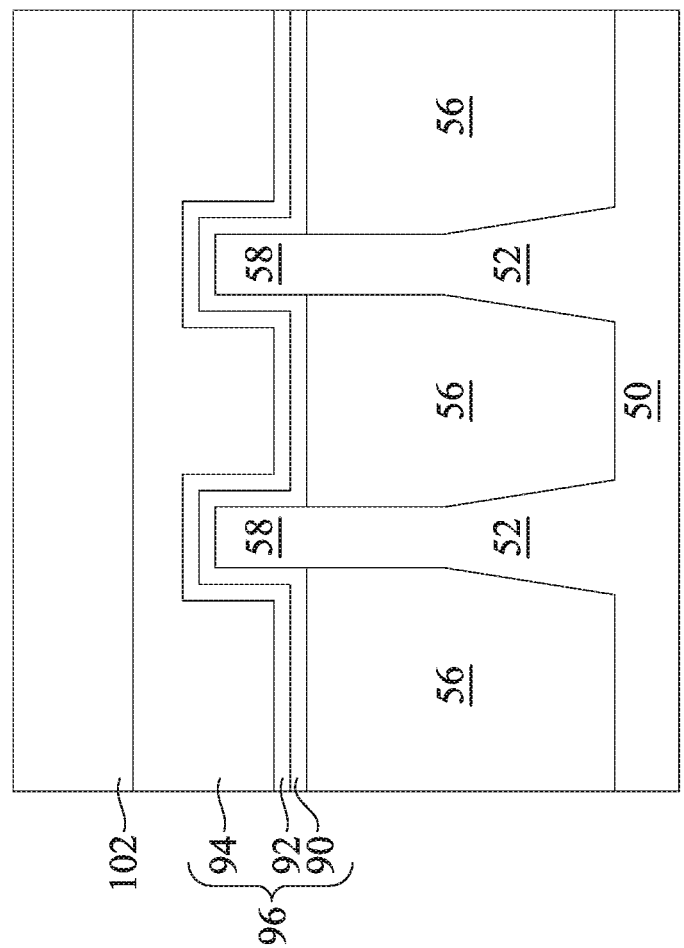
Figure 27B:
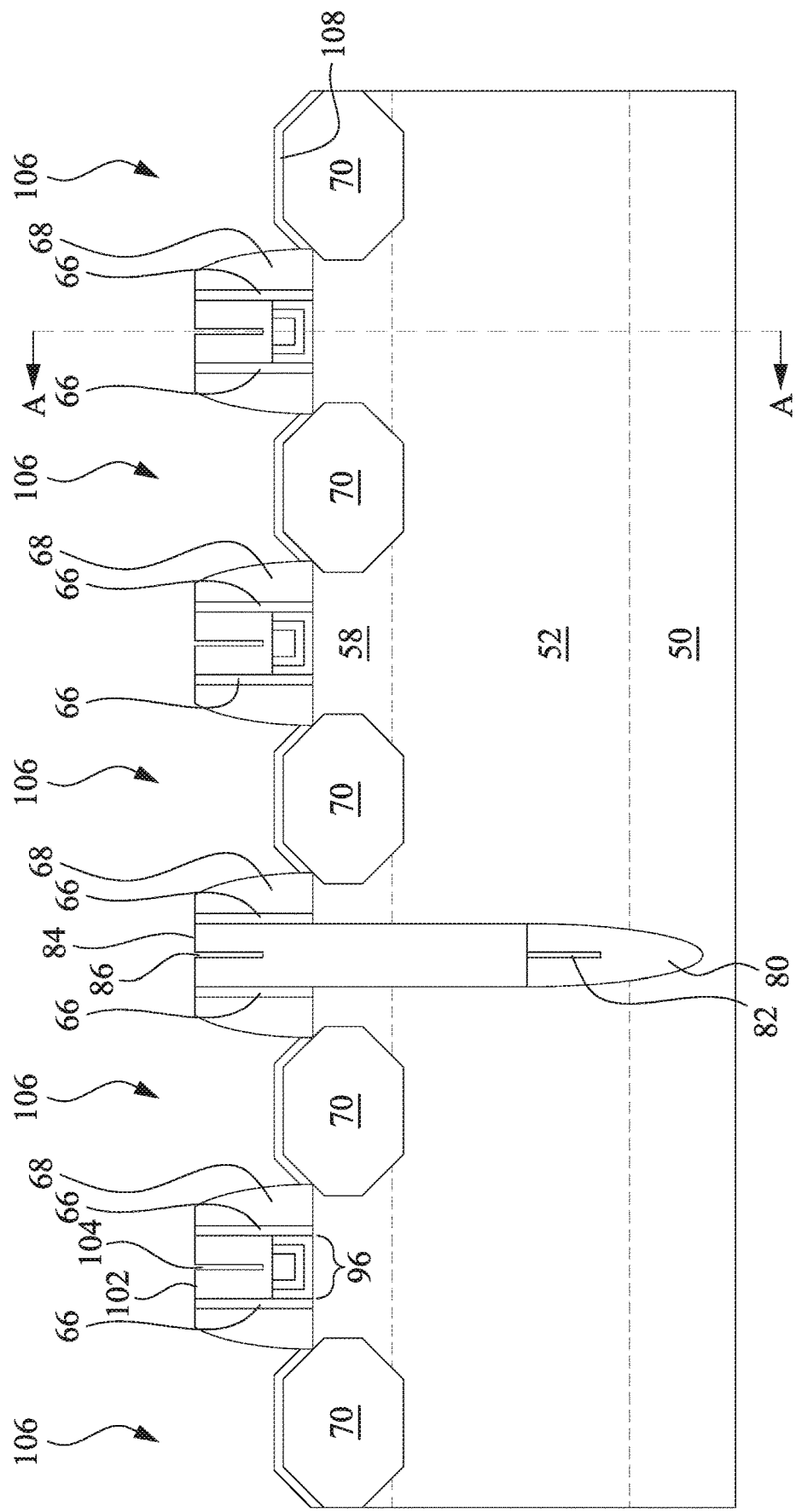

In FIGS. 27A and 27B, silicide layers 108 are formed over the epitaxial source/drain regions 70 through the openings 106. In some embodiments, a metallic material is deposited over the epitaxial source/drain regions 70. The metallic material may comprise Ti, Co, Ni, NiCo, Pt, NiPt, Ir, PtIr, Er, Yb, Pd, Rh, Nb, a combination thereof, or the like, and may be formed using PVD, ALD, CVD, a combination thereof, or the like. Subsequently, an annealing process is performed to form the silicide layers 108. In some embodiments where the epitaxial source/drain regions 70 comprise silicon, the annealing process causes the metallic material to react with silicon to form a silicide of the metallic material at interfaces between the metallic material and the epitaxial source/drain regions 70. After forming the silicide layers 108, unreacted portions of the metallic material are removed using a suitable removal process, such as a suitable etch process, for example.

Figure 28A:
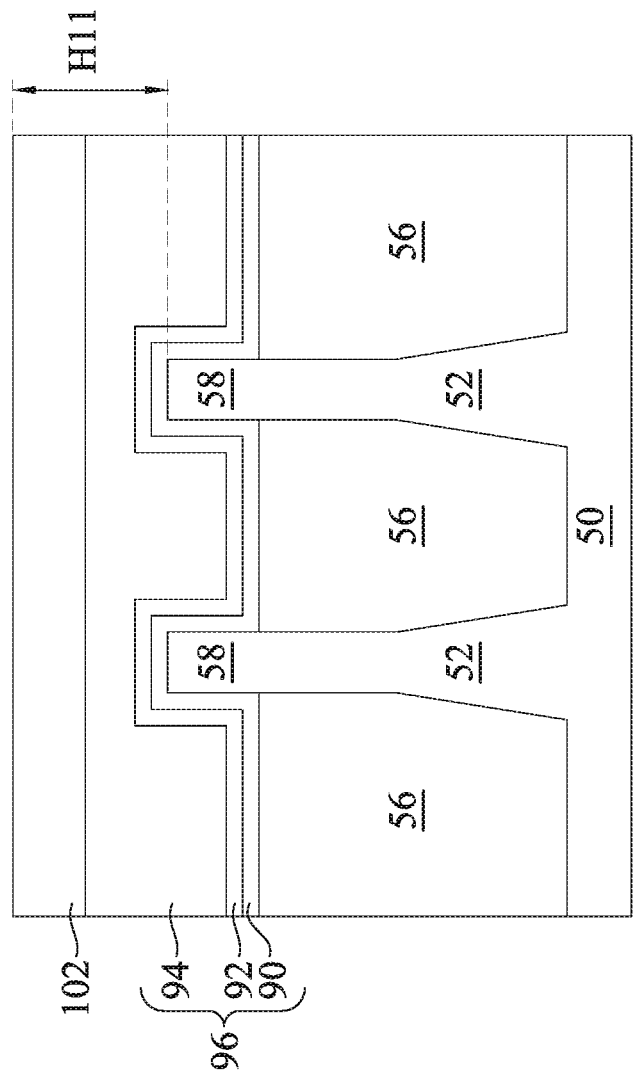
Figure 28B:
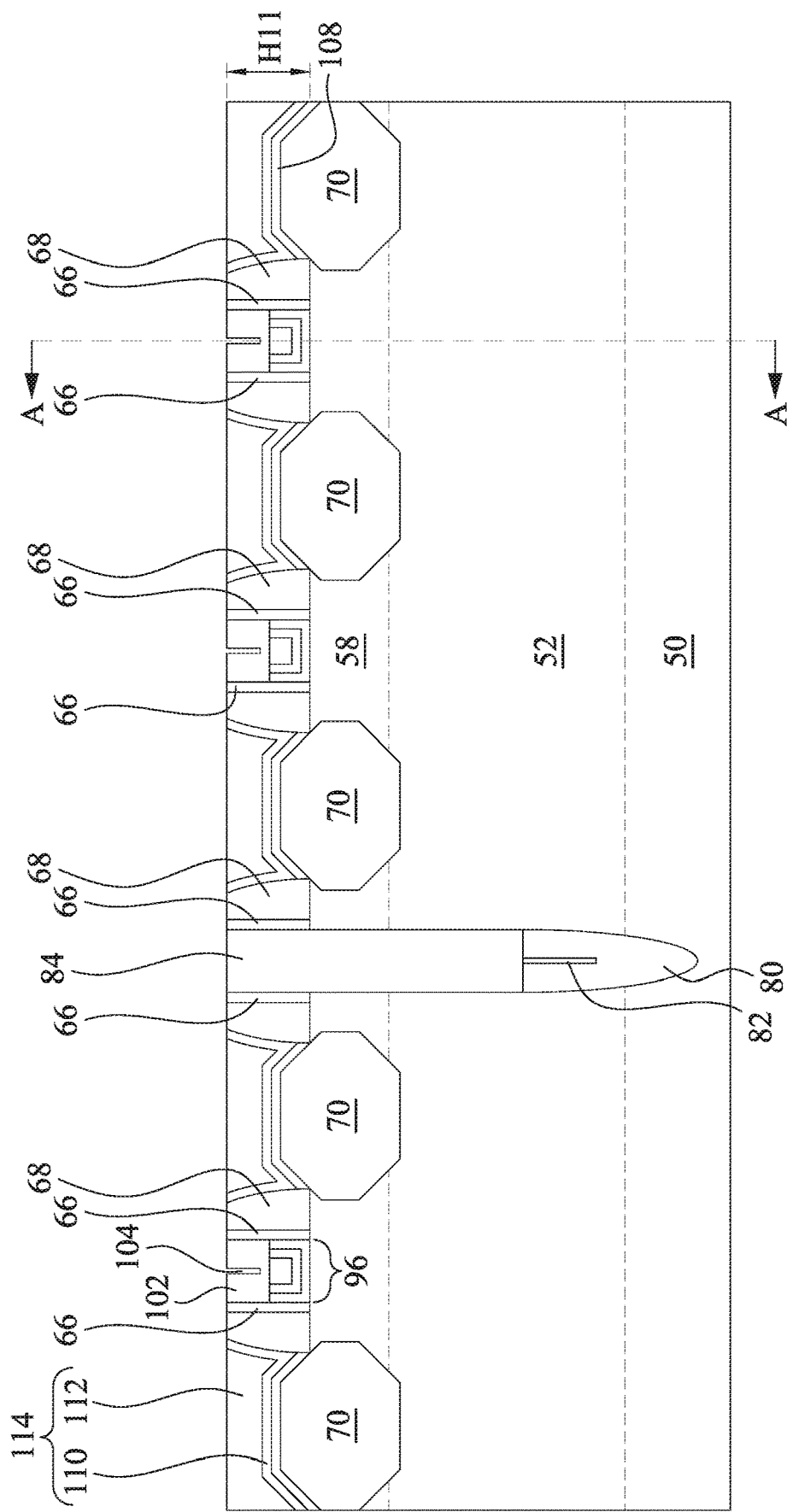

In FIGS. 28A and 28B, source/drain contacts 114 are formed in the openings 106 (see FIGS. 27A and 27B). In some embodiments, the source/drain contacts 114 are formed by forming a liner 110 and a conductive material 112 in the openings 106. The liner 110 may be a diffusion barrier layer, an adhesion layer, or the like. The liner 110 may include titanium, titanium nitride, tantalum, tantalum nitride, a combination thereof, or the like, and may be formed using PVD, sputtering, plating, a combination thereof, or the like. The conductive material 112 may include copper, a copper alloy, silver, gold, tungsten, cobalt, aluminum, nickel, a combination thereof, or the like, and may be formed using PVD, CVD, sputtering, plating, a combination thereof, or the like. In some embodiments, portions of the liner 110 and the conductive material 112 may penetrate into the seam 86 (see FIG. 27B). However, since the seam 86 does not extend below the top surfaces of the fins 52, an amount of the penetrated material is reduced.

In some embodiments, a planarization process, such as a CMP process, may be performed to remove excess portions of the liner 110 and the conductive material 112 and expose top surfaces of gate masks 102. The remaining portions of the liner 110 and the conductive material 112 form the source/drain contacts 114. The source/drain contacts 114 are electrically coupled to the respective epitaxial source/drain regions 70 through the silicide layers 108. In some embodiments, top surfaces of the gate masks 102 and top surfaces of the source/drain contacts 114 are substantially level or coplanar (within process variations) after the planarization process is completed.

In some embodiments, the planarization process also removes portions of the gate masks 102, the gate seal spacers 66, the gate spacers 68, and the dielectric material 84, such that the seam 86 (see FIG. 27B) in the dielectric material 84 is completely removed. In some embodiments, by removing the seam 86 (see FIG. 27B), portions of the conductive material that may have penetrated in the seam 86 during the formation of the source/drain contacts 114 are also removed. Accordingly, shorting of the source/drain contacts 114 disposed on opposite sides of the dielectric material 84 is avoided. In some embodiments, after performing the planarization process, the gate masks 102 have top surfaces, which are disposed above the fins 52 at a height H11 as measured from the top surfaces of the fins 52. In some embodiments, the height H11 is less than the height H10 (see FIG. 25B). In some embodiments, the height H11 is less than or equal to the height H4 (see FIG. 21B). In some embodiments, the height H11 is between about 20 nm and about 30 nm.

Figure 29A:
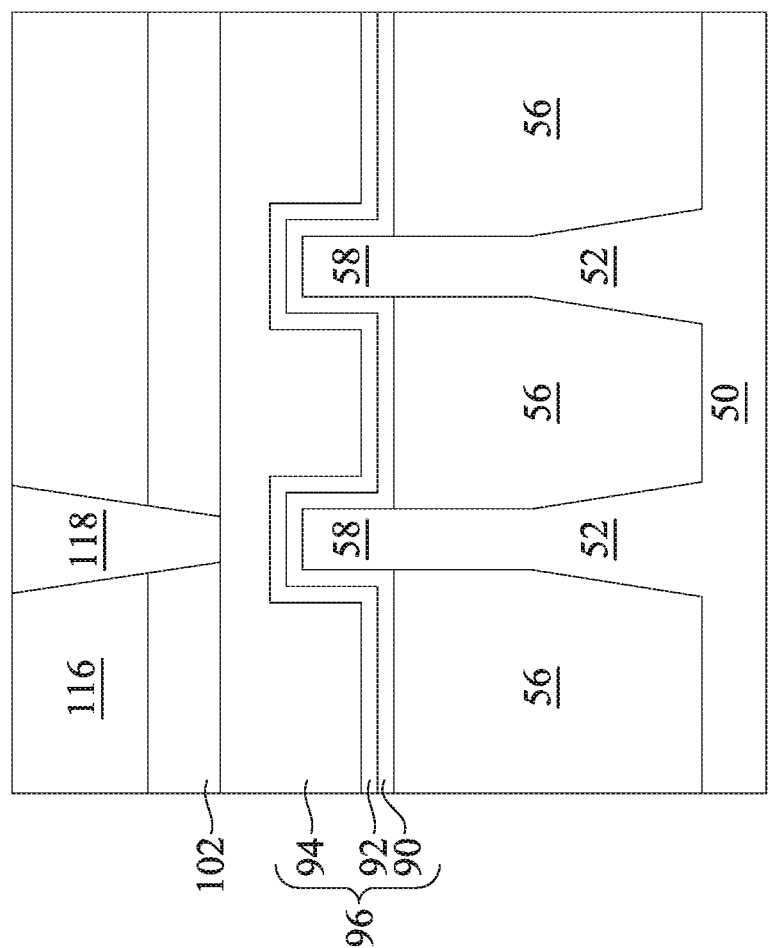
Figure 29B:
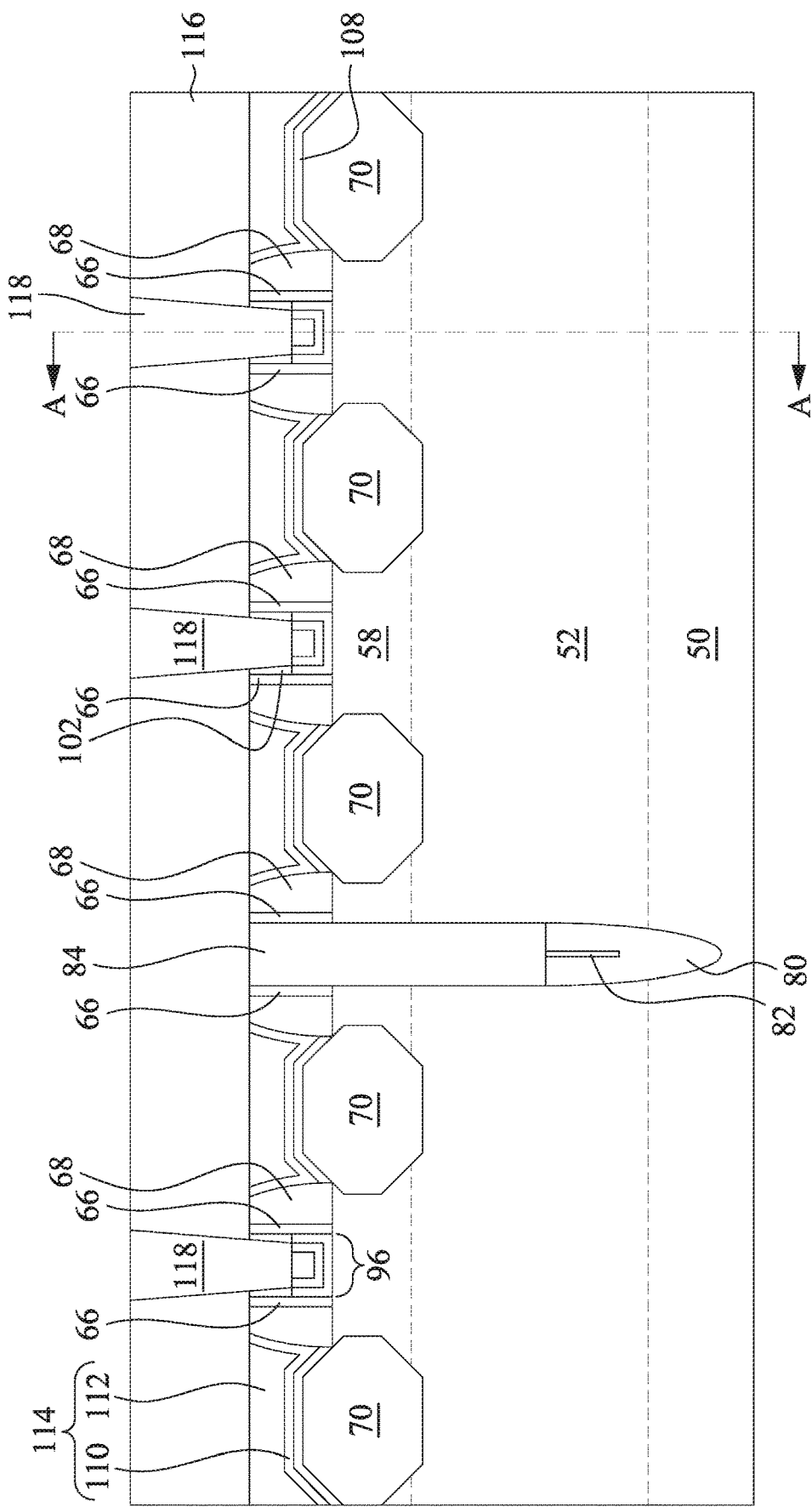

In FIGS. 29A and 29B, after performing the planarization process, an ILD 116 is deposited over the gate stacks 96 and the source/drain contacts 114. In some embodiments, the ILD 116 may be formed using similar materials and methods as the ILD 74 described above with reference to FIGS. 11A and 11B, and the description is not repeated herein. In some embodiments, the ILD 74 and the ILD 116 comprise a same material. In other embodiments, the ILD 74 and the ILD 116 comprise different materials.

After forming the ILD 116, openings for the gate contacts 118 are formed through the ILD 116 and the gate masks 102. The openings may be formed using acceptable photolithography and etching techniques. Subsequently, the gate contacts 118 are formed in the openings. In some embodiments, the gate contacts 118 are formed using similar materials and method as the source/drain contacts 114 described above with reference to FIGS. 28A and 28B, and the description is not repeated herein.

Embodiments may achieve advantages. Various embodiments discussed herein allow for improving a dielectric material gap-fill performance for a trench formed during a fin cut process, reducing or avoiding issues due to a seam and/or void formation in the dielectric material within the trench, reducing or avoiding shorting between contact plugs, and improving device and yield performance. In some embodiments, the trench formed during the fin cut process is filled with a plurality of dielectric materials. In some embodiments, the trench filling process may include filling the trench with a first dielectric material, partially removing the first dielectric material from the trench such that an upper portion of the trench is not filled with a dielectric material, and filling the upper portion of the trench with a second dielectric material. The second dielectric material may be same or different from the first dielectric material.

In accordance with an embodiment, a device includes a substrate, a first isolation structure and a second isolation structure over the substrate, a semiconductor fin over the substrate and between the first isolation structure and the second isolation structure, and a third isolation structure extending through the semiconductor fin and between the first isolation structure and the second isolation structure. A top surface of the semiconductor fin is above a top surface of the first isolation structure and a top surface of the second isolation structure. The third isolation structure includes a first dielectric material and a second dielectric material over the first dielectric material. An interface between the first dielectric material and the second dielectric material is below the top surface of the first isolation structure and the top surface of the second isolation structure. In an embodiment, the first dielectric material extends below a bottom surface of the first isolation structure and a bottom surface of the second isolation structure. In an embodiment, the second dielectric material extends along and is in physical contact with the top surface and sidewalls of the first isolation structure. In an embodiment, a top surface of the third isolation structure is above the top surface of the first isolation structure and the top surface of the second isolation structure. In an embodiment, a top surface of the third isolation structure is above the top surface of the semiconductor fin. In an embodiment, the device further includes a gate stack over the semiconductor fin and adjacent to the third isolation structure, a top surface of the gate stack being below a top surface of the third isolation structure. In an embodiment, the first dielectric material is different from the second dielectric material.

In accordance with another embodiment, a device includes a substrate, a semiconductor fin extending from a top surface of the substrate, a gate stack extending along a top surface and sidewalls of the semiconductor fin, a source/drain region extending into the semiconductor fin adjacent to the gate stack, and an isolation structure extending into the semiconductor fin adjacent to the source/drain region. The source/drain region is interposed between the isolation structure and the gate stack. The isolation structure includes a first dielectric material and a second dielectric material over the first dielectric material. An interface between the first dielectric material and the second dielectric material is below the top surface of the semiconductor fin. In an embodiment, the first dielectric material is different from the second dielectric material. In an embodiment, the first dielectric material extends into the substrate. In an embodiment, the interface between the first dielectric material and the second dielectric material is above the top surface of the substrate. In an embodiment, a top surface of the second dielectric material is above a top surface of the gate stack. In an embodiment, the interface between the first dielectric material and the second dielectric material is below a bottom surface of the source/drain region. In an embodiment, the device further includes a spacer structure extending along a sidewall of the isolation structure, where the spacer structure is in physical contact with the second dielectric material.

In accordance with yet another embodiment, a method includes forming a semiconductor fin over a substrate. A dummy gate structure is formed over the semiconductor fin. Spacers are formed on opposite sidewalls of the dummy gate structure. The dummy gate structure is removed to form a trench between the spacers. The trench exposes the semiconductor fin. An etching process is performed on the semiconductor fin to extend the trench into the semiconductor fin. The trench is filled with a first dielectric material. The first dielectric material is etched back. A second dielectric material is deposited in the trench and over the first dielectric material. In an embodiment, the etching process further extends the trench into the substrate. In an embodiment, a top surface of the first dielectric material is below a top surface of the semiconductor fin after etching back the first dielectric material. In an embodiment, the first dielectric material is different from the second dielectric material. In an embodiment, the second dielectric material has a seam within the trench. In an embodiment, the seam is removed.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A method comprising:
 forming a semiconductor fin over a substrate;
 forming a dummy gate structure over the semiconductor fin;

forming spacers on opposite sidewalls of the dummy gate structure;

removing the dummy gate structure to form a trench between the spacers, the trench exposing the semiconductor fin;

performing an etching process on the semiconductor fin to extend the trench into the semiconductor fin;

filling the trench with a first dielectric material;

etching back the first dielectric material;

depositing a second dielectric material in the trench and over the first dielectric material, wherein the second dielectric material has a first seam within the trench; and completely removing the first seam in the trench.

2. The method of claim 1, wherein the etching process further extends the trench into the substrate.

3. The method of claim 1, wherein a top surface of the first dielectric material is below a top surface of the semiconductor fin after etching back the first dielectric material.

4. The method of claim 1, wherein the first dielectric material is different from the second dielectric material.

5. The method of claim 1, wherein the first dielectric material has a second seam, wherein after etching back the first dielectric material a portion of the second seam remains, wherein depositing the second dielectric material comprises depositing the second dielectric material over remaining portions of the second seam.

6. The method of claim 1, wherein depositing the second dielectric material forms a void between the first dielectric material and the second dielectric material.

7. The method of claim 1, wherein a widest width of the first dielectric material is greater than a widest width of the second dielectric material in a cross-sectional view.

8. A method of forming a semiconductor device, the method comprising:

forming a semiconductor fin over a substrate;

forming a dummy gate structure over the semiconductor fin;

forming one or more dielectric layers on opposing sidewalls of the dummy gate structure;

removing the dummy gate structure to form a trench, the trench exposing the semiconductor fin;

performing an etching process on the semiconductor fin to extend the trench into the semiconductor fin;

forming a first dielectric material in the trench, an upper surface of the first dielectric material being lower than an upper surface of the semiconductor fin;

forming a second dielectric material over the first dielectric material, an upper surface of the second dielectric material being higher than an upper surface of the semiconductor fin, wherein the second dielectric material has a void or seam; and removing an upper portion of the second dielectric material to completely remove the void or seam.

9. The method of claim 8, wherein after forming the first dielectric material, an upper surface of the first dielectric material has a recess.

10. The method of claim 9, wherein forming the second dielectric material comprises forming the second dielectric material over the recess to form a void.

11. The method of claim 8, wherein a widest width of the first dielectric material is greater than a widest width of the second dielectric material in a cross-sectional view perpendicular to a longitudinal axis of the semiconductor fin.

12. The method of claim 9, wherein forming the second dielectric material comprises filling the recess with the second dielectric material.

13. The method of claim 8, wherein after forming the second dielectric material, the second dielectric material has a void.

14. The method of claim 10, further comprising forming a source/drain region adjacent the dummy gate structure, wherein an upper surface of the void is lower than a lower surface of the source/drain region.

15. A method of forming a semiconductor device, the method comprising:

forming a semiconductor fin extending from a top surface of a substrate;

forming a source/drain region extending into the semiconductor fin;

forming an isolation structure extending into the semiconductor fin adjacent to the source/drain region, wherein forming the isolation structure comprises:

forming a first dielectric material, wherein forming the first dielectric material comprises:

forming a first dielectric layer in a trench, the first dielectric layer having a first void in the trench; and recessing the first dielectric layer to expose the first void, wherein remaining portions of the first dielectric layer forms the first dielectric material; and forming a second dielectric material over the first dielectric material, wherein an interface between the first dielectric material and the second dielectric material is below the top surface of the semiconductor fin, wherein the first void extends from a surface of second dielectric material to a surface of the first dielectric material, wherein forming the second dielectric material comprises:

forming a second dielectric layer over the first dielectric material in the trench, the second dielectric layer having a second void in the trench; and removing an upper portion of the second dielectric layer to completely remove the second void; and forming a gate stack extending along a top surface and sidewalls of the semiconductor fin, the source/drain region being interposed between the isolation structure and the gate stack.

16. The method of claim 15, wherein the first dielectric material extends into the substrate a distance in a range between 30 nm and 50 nm.

17. The method of claim 15, wherein a width of the first dielectric material decreases as the first dielectric material extends from the top surface of the semiconductor fin toward the second dielectric material.

18. The method of claim 15, wherein an upper surface of the first void is lower than a lower surface of the source/drain region.

19. The method of claim 18, wherein a bottom surface of the first void is higher than a bottom of the semiconductor fin.

20. The method of claim 15, wherein the first dielectric material is different from the second dielectric material.

* * * * *